(12) United States Patent
Nakamura et al.

(10) Patent No.: US 7,046,102 B2
(45) Date of Patent: May 16, 2006

(54) SURFACE ACOUSTIC WAVE FILTER, BALANCED TYPE CIRCUIT, AND COMMUNICATION APPARATUS

(75) Inventors: Hiroyuki Nakamura, Osaka (JP); Keiji Onishi, Osaka (JP); Takashi Inoue, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 10/473,129

(22) PCT Filed: Mar. 3, 2003

(86) PCT No.: PCT/JP03/02409

§ 371 (c)(1),
(2), (4) Date: May 4, 2004

(87) PCT Pub. No.: WO03/075458

PCT Pub. Date: Sep. 12, 2003

(65) Prior Publication Data

US 2004/0233020 A1 Nov. 25, 2004

(30) Foreign Application Priority Data

Mar. 6, 2002 (JP) ............................. 2002-060343

(51) Int. Cl.
*H03H 9/72* (2006.01)
*H03H 9/64* (2006.01)

(52) U.S. Cl. ..................... 333/133; 333/195

(58) Field of Classification Search ........ 333/193–195, 333/133; 310/313 A

See application file for complete search history.

(56) References Cited

U.S. PATENT DOCUMENTS

| 3,582,840 | A | * | 6/1971 | DeVries | 333/193 |
|---|---|---|---|---|---|
| 3,760,299 | A | | 9/1973 | Vasile | 333/151 |
| 3,839,687 | A | * | 10/1974 | Subramanian | 333/194 |
| 3,868,608 | A | * | 2/1975 | Williams | 333/193 |
| 3,872,410 | A | * | 3/1975 | Zucker | 333/194 |
| 4,038,615 | A | | 7/1977 | Ishiyama et al. | 333/193 |
| 4,063,202 | A | * | 12/1977 | Vasile | 333/194 |
| 4,065,734 | A | | 12/1977 | Takeno et al. | 333/150 |
| 6,781,478 | B1 | * | 8/2004 | Takamine et al. | 333/133 |

FOREIGN PATENT DOCUMENTS

| JP | 52-03060 | 3/1977 |
|---|---|---|
| JP | 52-03061 | 3/1977 |

(Continued)

OTHER PUBLICATIONS

Gualtieri et al., "Piezoelectric Materials for Acoustic Wave Applications", IEEE Transactions on Ultrasonics, Ferroelectrics, and Frequency Control, vol. 41, No. 1, Jan. 1994, pp. 53-59.*

(Continued)

*Primary Examiner*—Barbara Summons
(74) *Attorney, Agent, or Firm*—RatnerPrestia

(57) ABSTRACT

A surface acoustic wave filter including a piezoelectric substrate, IDT electrodes which are formed on the piezoelectric substrate and are connected to balanced type terminals. Further, IDT electrodes are formed on the piezoelectric substrate and are connected to an unbalanced type terminal, connection electrodes of connecting the IDT electrodes, the IDT electrodes IDT electrodes to the balanced type terminals or the unbalanced type terminal, and a dielectric thin film formed between the piezoelectric substrate and the IDT electrodes, the IDT electrodes, the connection electrodes.

15 Claims, 20 Drawing Sheets

FOREIGN PATENT DOCUMENTS

| | | |
|---|---|---|
| JP | 11-88101 | 3/1999 |
| JP | 2002-151997 | 5/2002 |
| WO | WO 97 42705 A | 11/1997 |
| WO | WO 03/010888 * | 2/2003 |

OTHER PUBLICATIONS

PCT International Search Report for Application No. PCT/JP03/02409 dated Aug. 8, 2003.

* cited by examiner

THICKNESS OF DIELECTRIC THIN FILM 201' [Å]

SURFACE ACOUSTIC WAVE FILTER, BALANCED TYPE CIRCUIT, AND COMMUNICATION APPARATUS

This Application is a U.S. National Phase Application of PCT International Application No. PCT/JP03/02409.

TECHNICAL FIELD

The present invention relates to a surface acoustic wave filter, a balanced type circuit, and a communication apparatus that are used for high-frequency circuits in radio communication apparatus.

RELATED ART

Recent progress of mobile communication requires mobile device components with higher performance and smaller size. Further, in order to improve antinoise characteristics of such components, more balanced semiconductor components such as IC's (integrated circuits) have been provided while more balanced filters used in RF (radio frequency) stages are required.

Surface acoustic wave (SAW) filters have been widely used as a filter for an RF stage in mobile communication equipment. Particularly, a surface acoustic wave filter of longitudinally coupled mode type has been used as a filter for an RF stage, the filter having a balanced type terminal which can readily perform the above-described balancing. These filters have low loss, high attenuation, and excellent balance characteristics.

Referring to FIGS. 17(a) and 17(b), the configuration of the conventional surface acoustic wave filter will be discussed below. FIG. 17(a) is a plan view of the conventional surface acoustic wave filter, and FIG. 17(b) is a sectional view showing the conventional surface acoustic wave filter taken along line A–A'.

As shown in FIG. 17(a), the conventional surface acoustic wave filter is a surface acoustic wave filter of longitudinally coupled mode type that comprises a piezoelectric substrate 100, IDT (inter-digital transducer) electrodes 110 which are formed on the piezoelectric substrate 100 and are connected to balanced type terminals 161 and 162, IDT electrodes 120 which are formed on the piezoelectric substrate 100 and are connected to an unbalanced type terminal 171, IDT electrodes 130 which are formed on the piezoelectric substrate 100 and are connected to the unbalanced type terminal 171, a connection electrode 181 of connecting the IDT electrode 110 to the balanced type terminal 161, a connection electrode 182 of connecting the IDT electrode 110 to the balanced type terminal 162, a connection electrode 191 of connecting the IDT electrodes 120 and 130 to the unbalanced type terminal 171, and reflector electrodes 140 and 150.

Next, the configuration of the conventional surface acoustic wave filter will be described in detail.

The piezoelectric substrate 100 is made of lithium tantalate (LiTaO$_3$) having an effective relative dielectric constant of about 40 or more and is formed like a plate. Besides, the effective relative dielectric constant is defined as $(\in 11^T \times \in 33^T)^{1/2}$ where $\in 11^T$ and $\in 33^T$ represent relative dielectric constant tensors.

The IDT electrode 110 has a plurality of electrode fingers which are formed like comb teeth on the piezoelectric substrate 100 (see FIG. 17(b)). These electrode fingers are constituted by metallic thin films of an aluminum alloy having a low resistance. The upper bus bar of the IDT electrode 110 is connected to the balanced type terminal 161 via the connection electrode 181, and the lower bus bar of the IDT electrode 110 is connected to the balanced type terminal 162 via the connection electrode 182.

The IDT electrode 120 is similar in configuration to the IDT electrode 110 and has a plurality of electrode fingers which are formed like comb teeth on the piezoelectric substrate 100 (see FIG. 17(b)). These electrode fingers are made of metallic thin films of an aluminum alloy having a low resistance. The upper bus bar of the IDT electrode 120 is connected to the unbalanced type terminal 171 via the connection electrode 191, and the lower bus bar of the IDT electrode 120 is grounded.

The IDT electrode 130 is similar in configuration to the IDT electrode 120 and has a plurality of electrode fingers which are formed like comb teeth on the piezoelectric substrate 100 (see FIG. 17(b)). These electrode fingers are constituted by metallic thin films of an aluminum alloy having a low resistance. The upper bus bar of the IDT electrode 130 is connected to the unbalanced type terminal 171 via the connection electrode 191, and the lower bus bar of the IDT electrode 130 is grounded.

The reflector electrode 140 has a plurality of electrode fingers which are formed like comb teeth on the piezoelectric substrate 100 (see FIG. 17(b)). These electrode fingers are made of metallic thin films of an aluminum alloy having a low resistance. The reflector electrode 140 is designed so as to reflect a surface acoustic wave propagated in the direction of arrow X without leaking the wave to side A.

The reflector electrode 150 has a plurality of electrode fingers which are formed like comb teeth on the piezoelectric substrate 100 (see FIG. 17(b)). These electrode fingers are made of metallic thin films of an aluminum alloy having a low resistance. The reflector electrode 150 is designed so as to reflect a surface acoustic wave propagated in the direction of arrow Y without leaking the wave to side A'.

Next, the operation of the conventional surface acoustic wave filter will be discussed.

The following will discuss the case where the balanced type terminals 161 and 162 are input terminals and the unbalanced type terminal 171 is an output terminal (similarly when the unbalanced type terminal 171 is an input terminal and the balanced type terminals 161 and 162 are output terminals).

When an input electric signal is inputted from the balanced type terminals 161 and 162, a surface acoustic wave is excited on the piezoelectric substrate 100. The excited surface acoustic wave is contained between the reflector electrode 140 and the reflector electrode 150. In the surface acoustic wave filter of longitudinally coupled mode type, filtering is performed using a resonant mode produced thus and an output electric signal is output from the unbalanced type terminal 171.

Referring to FIGS. 18(a) to 18(c), the following will discuss a balance characteristic of the conventional surface acoustic wave filter in a pass band of 900 MHz. FIG. 18(a) is an explanatory drawing showing the relationship between a frequency and a passing characteristic of the conventional surface acoustic wave filter, FIG. 18(b) is an explanatory drawing showing the relationship between a frequency and an amplitude balance characteristic of the conventional surface acoustic wave filter, and FIG. 18(c) is an explanatory drawing showing the relationship between a frequency and a phase balance characteristic of the conventional surface acoustic wave filter.

In FIGS. 18(b) to 18(c), f1 represents a low-pass side frequency at a point reduced from a minimum loss by 2 dB, f2 represents a high-pass side frequency at a point reduced from a minimum loss by 2 dB, and f0 is a center frequency between f1 and f2.

The amplitude balance characteristic of the conventional surface acoustic wave filter is a deviation between amplitude of a signal between the balanced type terminal 161 and the unbalanced type terminal 171 and amplitude of a signal between the balanced type terminal 162 and the unbalanced type terminal 171. Therefore, when the deviation is 0, the amplitude balance characteristic is the most ideal without degradation.

Further, the phase balance characteristic of the conventional surface acoustic wave filter is a deviation from 180° of a difference between a phase of a signal between the balanced type terminal 161 and the unbalanced type terminal 171 and a phase of a signal between the balanced type terminal 162 and the unbalanced type terminal 171. Therefore, when the deviation is 0, the phase balance characteristic is the most ideal free from degradation.

Further, a surface acoustic wave filter is provided which has a dielectric thin film formed between a piezoelectric substrate and IDT electrodes connected to the unbalanced type terminal (see, for example, Japanese Patent Laid-Open No. 52-30360, Japanese Patent Laid-Open No. 52-30361 and Japanese Patent Laid-Open No. 11-88101). However, such a surface acoustic wave filter does not have IDT electrodes connected to the balanced type terminal, and the dielectric thin film is used for adjusting a frequency and protecting a soluble piezoelectric substrate.

The disclosures of the documents "Japanese Patent Laid-Open No. 52-30360," "Japanese Patent Laid-Open No. 52-30361," and "Japanese Patent Laid-Open No. 11-88101" are incorporated herein by reference in their entirety.

However, the amplitude balance characteristic of the conventional surface acoustic wave filter has a minimum value of −1.7 dB and a maximum value of +1.0 dB, so that the fluctuation is no less than 2.7 dB in a pass band of $f1 \leq f \leq f2$ (see FIG. 18(b)). Further, the phase balance characteristic of the conventional surface acoustic wave filter has a minimum value of −8 deg and a maximum value of +9 deg, so that the fluctuation is no less than 17 deg in a pass band of $f1 \leq f \leq f2$ (see FIG. 18(c)).

As described above, the conventional surface acoustic wave filter cannot obtain a sufficiently preferred balance characteristic (FIGS. 18(a) to 18(c)).

In addition, there are few studies on the cause of degradation in balance characteristic of the conventional surface acoustic wave filter.

DISCLOSURE OF THE INVENTION

In view of the above conventional problems, it is an object of the present invention to provide a surface acoustic wave filter, a balanced type circuit, and a communication apparatus whereby a more preferable balance characteristic can be achieved.

The 1st aspect of the present invention is a surface acoustic wave filter, comprising:

a piezoelectric substrate, a first IDT electrode which is formed on the piezoelectric substrate and is connected to a balanced type terminal, a second IDT electrode which is formed on the piezoelectric substrate and is connected to a balanced type terminal or an unbalanced type terminal, a connection electrode connecting the first IDT electrode and the second IDT electrode to the balanced type terminal or the unbalanced type terminal, respectively, and a dielectric thin film formed between the piezoelectric substrate and at least one of the first IDT electrode, the second IDT electrode, and the connection electrode.

The 2nd aspect of the present invention is the surface acoustic wave filter according to the 1st aspect, wherein the connection electrode comprises a first connection electrode connecting the first IDT electrode to the balanced type terminal and a second connection electrode connecting the second IDT electrode to the balanced type terminal or the unbalanced type terminal, and the dielectric thin film is formed so as to further reduce at least one of (a) capacitance between the first IDT electrode and the second IDT electrode, (b) capacitance between the first IDT electrode and the second connection electrode, (c) capacitance between the first connection electrode and the second IDT electrode, and (d) capacitance between the first connection electrode and the second connection electrode.

The 3rd aspect of the present invention is the surface acoustic wave filter according to the 1st aspect, wherein the dielectric thin film is formed like a plane on the piezoelectric substrate, and the first IDT electrode, the second IDT electrode, and the connection electrode are formed on the dielectric thin film formed like a plane.

The 4th aspect of the present invention is the surface acoustic wave filter according to the 1st aspect, wherein the dielectric thin film is formed between the piezoelectric substrate, and the first IDT electrode and the second IDT electrode but is not formed between the connection electrode and the piezoelectric substrate.

The 5th aspect of the present invention is the surface acoustic wave filter according to the 1st aspect, wherein the dielectric thin film is formed between the piezoelectric substrate and the connection electrode but is not formed between the piezoelectric substrate, and the first IDT electrode and the second IDT electrode.

The 6th aspect of the present invention is the surface acoustic wave filter according to the 1st aspect, comprising a covering dielectric thin film formed on at least one of the first IDT electrode, the second IDT electrode, and the connection electrode.

The 7th aspect of the present invention is the surface acoustic wave filter according to the 1st aspect, wherein the first IDT electrode and the second IDT electrode are arranged with a main propagating direction of a surface acoustic wave to be propagated on the piezoelectric substrate.

The 8th aspect of the present invention is the surface acoustic wave filter according to the 7th aspect, wherein the first IDT electrode is composed of two IDT electrodes arranged respectively on both sides of the second IDT electrode along the main propagating direction.

The 9th aspect of the present invention is the surface acoustic wave filter according to the 7th aspect, wherein the second IDT electrode is composed of two IDT electrodes arranged respectively on both sides of the first IDT electrode along the main propagating direction.

The 10th aspect of the present invention is the surface acoustic wave filter according to the 7th aspect, further comprising two reflector electrodes between which the first IDT electrode and the second IDT electrode arranged are arranged.

The 11th aspect of the present invention is the surface acoustic wave filter according to the 1st aspect, wherein the second IDT electrode is connected to the unbalanced type terminal.

The 12th aspect of the present invention is the surface acoustic wave filter according to the 1st aspect, wherein the dielectric thin film comprises silicon nitride or silicon oxide.

The 13th aspect of the present invention is the surface acoustic wave filter according to the 1st aspect, wherein the piezoelectric substrate comprises lithium tantalate or lithium niobate.

The 14th aspect of the present invention is the surface acoustic wave filter according to the 1st aspect, wherein the dielectric thin film is smaller in effective relative dielectric constant than the piezoelectric substrate.

The 15th aspect of the present invention is the surface acoustic wave filter according to the 14th aspect, wherein the dielectric thin film has a piezoelectric property.

The 16th aspect of the present invention is the surface acoustic wave filter according to the 14th aspect, wherein the piezoelectric substrate has an effective relative dielectric constant of about 40 or more.

The 17th aspect of the present invention is a balanced type circuit, comprising:
a balanced type semiconductor, performing on a transmission signal for transmission and/or a reception signal for reception, and
a surface acoustic wave filter according to the 1st aspect, being connected to the balanced type semiconductor and filtering on the transmission signal for transmission and/or the reception signal for reception.

The 18th aspect of the present invention is a communication apparatus, comprising:
transmitting and receiving means of performing transmission and/or reception, and
a surface acoustic wave filter according to the 1st aspect, performing filtering on a transmission signal for transmission and/or a reception signal for reception.

DESCRIPTION OF THE SYMBOLS

Figure 1:
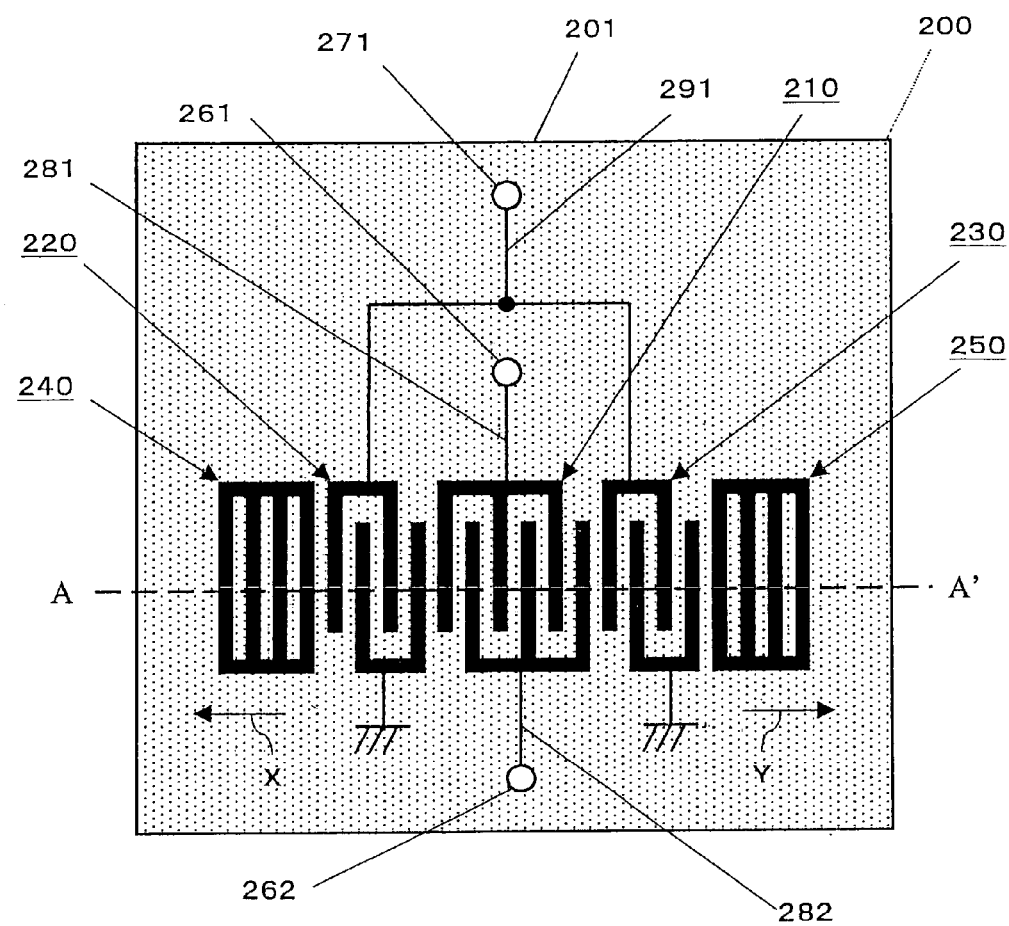
FIG. 1(a) is a plan view showing a surface acoustic wave filter according to Embodiment 1 of the present invention.
FIG. 1(b) is a sectional view showing the surface acoustic wave filter taken along line A–A' according to Embodiment 1 of the present invention.
Figure 1:
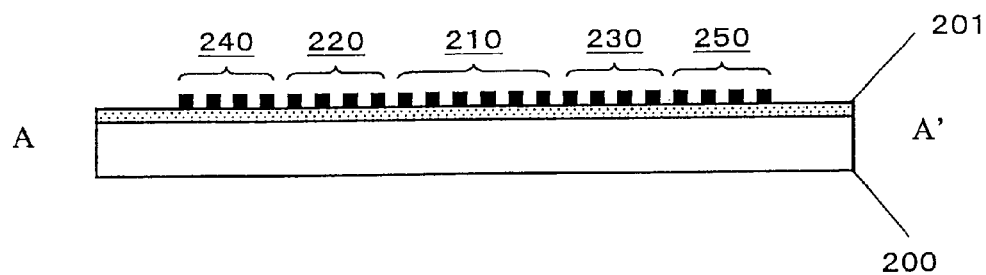

200 Piezoelectric substrate
201 Dielectric thin film
210, 220, 230 IDT electrode
240, 250 Reflector electrode
261, 262 Balanced type terminal
271 Unbalanced type terminal
281, 282, 291 Connection electrode

BEST MODE FOR CARRYING OUT THE INVENTION

The following will discuss embodiments of the present invention in accordance with the accompanied drawings.

EMBODIMENT 1

First, referring to FIGS. 1(a) and 1(b), the configuration of a surface acoustic wave filter will be discussed according to the present embodiment. FIG. 1(a) is a plan view showing the surface acoustic wave filter according to Embodiment 1 of the present invention, and FIG. 1(b) is a sectional view showing the surface acoustic wave filter taken along line A–A' according to Embodiment 1 of the present invention of Embodiment 1.

The surface acoustic wave filter of the present embodiment has a better balance characteristic as compared with the above conventional surface acoustic wave filter. The theoretical examination and the like about the cause will be specifically discussed later.

As shown in FIGS. 1(a) and 1(b), the surface acoustic wave filter of the present embodiment is a surface acoustic wave filter of longitudinally coupled mode type that comprises a piezoelectric substrate 200, IDT (inter-digital transducer) electrodes 210 connected to balanced type terminals 261 and 262, IDT electrodes 220 connected to an unbalanced type terminal 271, IDT electrodes 230 connected to the unbalanced type terminal 271, a connection electrode 281 of connecting the IDT electrode 210 to the balanced type terminal 261, a connection electrode 282 of connecting the IDT electrode 210 to the balanced type terminal 262, a connection electrode 291 connecting the IDT electrodes 220 and 230 to the unbalanced type terminal 271, a dielectric thin film 201 formed like a plane between the piezoelectric substrate 200 and the IDT electrodes 210, 220, and 230 and the connection electrodes 281, 282, and 291, and reflector electrodes 240 and 250.

For example, the piezoelectric substrate 200 corresponds to a piezoelectric substrate of the present invention, the IDT electrodes 210 correspond to a first IDT electrode of the present invention, the IDT electrodes 220 and 230 correspond to a second IDT electrode of the present invention, the connection electrodes 281 and 282 correspond to a first connection electrode of the present invention, the connection electrode 291 corresponds to a second connection electrode of the present invention, the dielectric thin film 201 corresponds to a dielectric thin film of the present invention, and the reflector electrodes 240 and 250 correspond to a reflector electrode of the present invention.

Further, the balanced type terminals 261 and 262 correspond to a balanced type terminal of the present invention, and the unbalanced type terminal 271 corresponds to an unbalanced type terminal of the present invention.

The surface acoustic wave filter of the present embodiment comprises comprising the dielectric thin film 201 formed like a plane between the piezoelectric substrate 200 and the IDT electrodes 210, 220, and 230 and the connection electrodes 281, 282, and 291.

The piezoelectric substrate 200 may be made of lithium tantalate having an effective relative dielectric constant of about 40 or more and is formed like a plate.

The dielectric thin film 201 is made of silicon nitride having an effective relative dielectric constant of about 10 and is formed like a plane (see FIG. 1(b)) with a thickness of about 200 Å on the piezoelectric substrate 200. A standardized film thickness ($=h/\lambda$) is about 0.5%, which is obtained by standardizing a thickness ($=h$) of the dielectric thin film 201 by a wavelength ($=\lambda$) of a surface acoustic wave. The dielectric thin film 201 is formed by a sputtering method.

The IDT electrode 210 has a plurality of electrode fingers which are formed like comb teeth on the dielectric thin film 201 (see FIG. 1(b)). These electrode fingers are made of metallic thin films of an aluminum alloy having a low resistance. The upper bus bar of the IDT electrode 210 is connected to the balanced type terminal 261 via the connection electrode 281, and the lower bus bar of the IDT electrode 210 is connected to the balanced terminal 262 via the connection electrode 282.

The IDT electrode 220 is similar in configuration to the IDT electrode 210 and has a plurality of electrode fingers which are formed like comb teeth (see FIG. 1(b)) on the dielectric thin film 201. These electrode fingers are made of metallic thin films of an aluminum alloy having a low resistance. The upper bus bar of the IDT electrode 220 is connected to the unbalanced type terminal 271 via the connection electrode 291 and the lower bus bar of the IDT electrode 220 is grounded.

The IDT electrode 230 is similar in configuration to the IDT electrode 220 and has a plurality of electrode fingers which are formed like comb teeth (see FIG. 1(b)) on the dielectric thin film 201. These electrode fingers are made of metallic thin films of an aluminum alloy having a low resistance. The upper bus bar of the IDT electrode 230 is connected to the unbalanced type terminal 271 via the connection electrode 291 and the lower bus bar of the IDT electrode 230 is grounded.

The connection electrodes 281, 282, and 291 are electrodes formed on the dielectric thin film 201 to make electrical connection.

The reflector electrode 240 has a plurality of electrode fingers which are formed like comb teeth (see FIG. 1(b)) on the dielectric thin film 201. These electrode fingers are made of metallic thin films of an aluminum alloy having a low resistance. The reflector electrode 240 is designed so as to reflect a surface acoustic wave propagated in the direction of arrow X without leaking the wave to A side.

The reflector electrode 250 has a plurality of electrode fingers which are formed like comb teeth (see FIG. 1(b)) on the dielectric thin film 201. These electrode fingers are made of metallic thin films of an aluminum alloy having a low resistance. The reflector electrode 250 is designed so as to reflect a surface acoustic wave propagated in the direction of arrow Y without leaking the wave to A' side.

The balanced type terminals 261 and 262 are terminals used for making connection to a balanced type device such as an amplifier (not shown).

The unbalance type terminal 271 is a terminal used for making connection to an unbalanced type device such as a switch (not shown).

Next, the operation of the surface acoustic wave filter will be discussed according to the present embodiment.

The following will discuss the case where the balanced type terminals 261 and 262 are input terminals and the unbalanced type terminal 271 is an output terminal (similarly in the case where the unbalance type terminal 271 is an input terminal and the balanced type terminals 261 and 262 are output terminals).

When an input electric signal is inputted from the balanced type terminals 261 and 262, a surface acoustic wave is exited on the piezoelectric substrate 200. The excited surface acoustic wave is contained between the reflector electrode 240 and the reflector electrode 250. In the surface acoustic wave filter of longitudinally coupled mode type, filtering is performed using a resonant mode and an output electric signal is extracted from the unbalanced type terminal 271.

Figure 2:
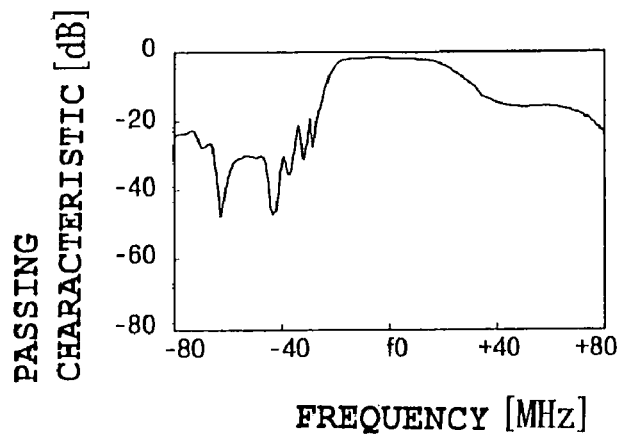
FIG. 2(a) is an explanatory drawing showing the relationship between a frequency and a passing characteristic of the surface acoustic wave filter according to Embodiment 1 of the present invention.
FIG. 2(b) is an explanatory drawing showing the relationship between a frequency and an amplitude balance characteristic of the surface acoustic wave filter according to Embodiment 1 of the present invention.
FIG. 2(c) is an explanatory drawing showing the relationship between a frequency and a phase balance characteristic of the surface acoustic wave filter according to Embodiment 1 of the present invention.
Figure 2:
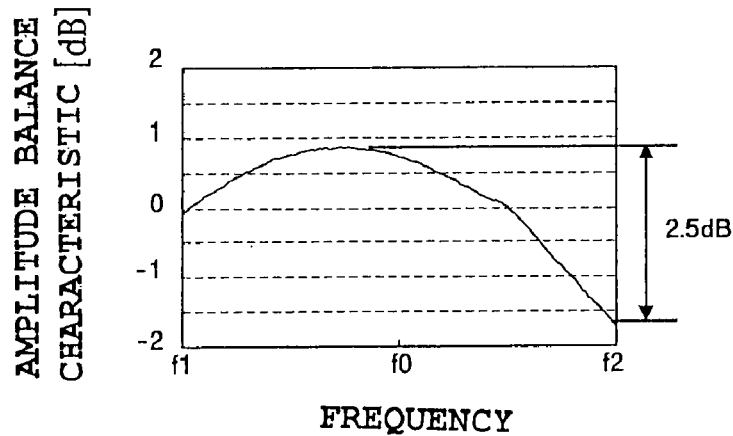
Figure 2:
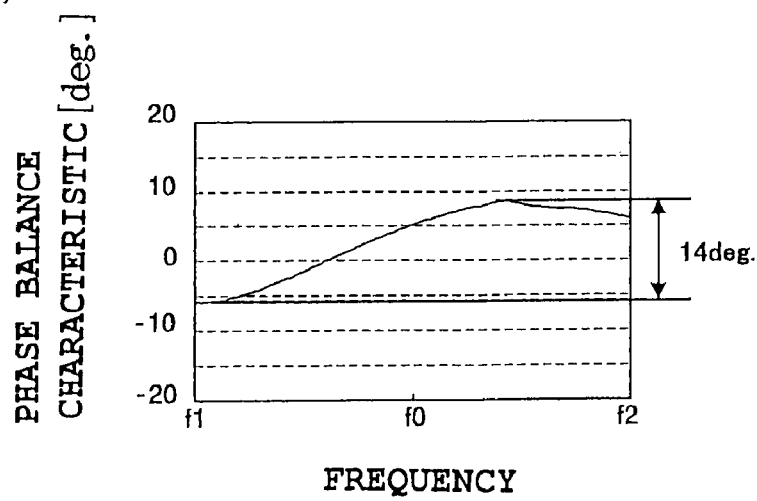

Referring to FIGS. 2(a) to 2(c), the following discusses a balance characteristic of the surface acoustic wave filter according to the present embodiment in a pass band of about 900 MHz. FIG. 2(a) is an explanatory drawing showing the relationship between a frequency and a passing characteristic of the surface acoustic wave filter according to Embodiment 1 of the present invention, FIG. 2(b) is an explanatory drawing showing the relationship between a frequency and an amplitude balance characteristic of the surface acoustic wave filter according to Embodiment 1 of the present invention, and FIG. 2(c) is an explanatory drawing showing the relationship between a frequency and a phase balance characteristic of the surface acoustic wave filter according to Embodiment 1 of the present invention.

In FIGS. 2(b) to 2(c), as with the above conventional surface acoustic wave filter, f1 represents a low-pass side frequency at a point reduced from a minimum loss by about 2 dB, f2 represents a high-pass side frequency at a point reduced from a minimum loss by about 2 dB, and f0 is a center frequency between f1 and f2.

As to the amplitude balance characteristic, the surface acoustic wave filter of the present embodiment has a minimum value of about −1.7 dB, a maximum value of about +0.8 dB, and a fluctuation of only about 2.5 dB in a pass band of $f1 \leq f \leq f2$ (see FIG. 2(b)). To be specific, for example, the surface acoustic wave filter of the present embodiment is smaller in fluctuation of the amplitude balance characteristic than the conventional surface acoustic wave filter (see FIG. 18(b)) by no less than about 0.2 dB.

Further, as to the phase balance characteristic, the surface acoustic wave filter of the present embodiment has a minimum value of about −5 deg, a maximum value of about +9 deg, and a fluctuation of only about 14 deg in a pass band of $f1 \leq f \leq f2$ (FIG. 2(c)). To be specific, for example, the surface acoustic wave filter of the present embodiment is smaller in variation of the phase balance characteristic than the conventional surface acoustic wave filter (FIG. 18(c)) by no less than about 3 deg.

Figure 18:
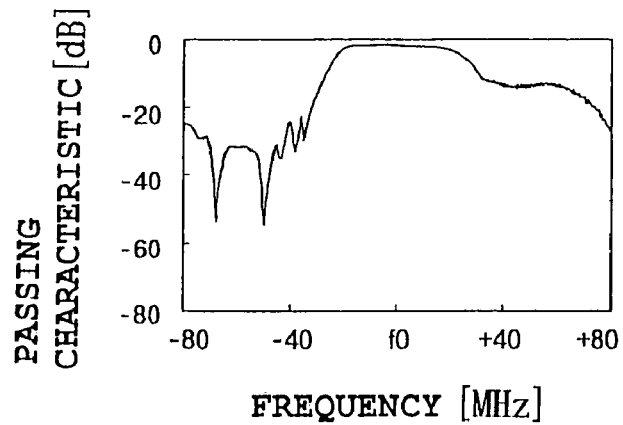
FIG. 18(a) is an explanatory drawing showing the relationship between a frequency and a passing characteristic of the conventional surface acoustic wave filter.
FIG. 18(b) is an explanatory drawing showing the relationship between a frequency and an amplitude balance characteristic of the conventional surface acoustic wave filter.
FIG. 18(c) is an explanatory drawing showing the relationship between a frequency and a phase balance characteristic of the surface acoustic wave filter.
Figure 18:
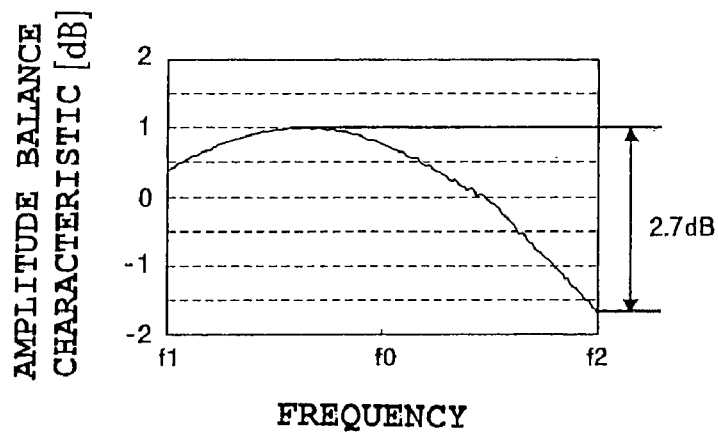
Figure 18:
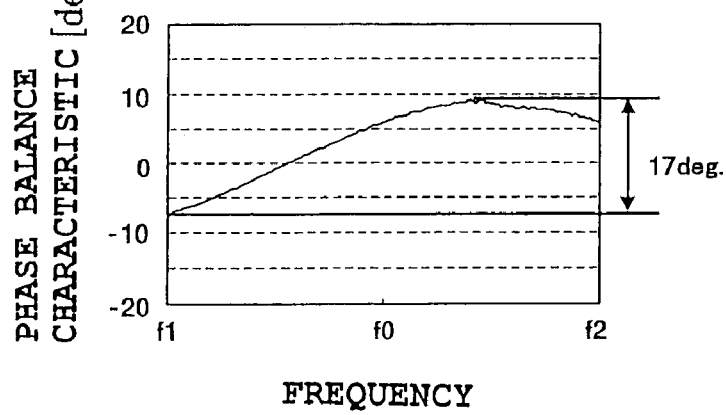

As described above, the surface acoustic wave filter of the present embodiment has better balance characteristics as compared with the above conventional surface acoustic wave filter (see FIGS. 18(a) to 18(c)).

The surface acoustic wave filter of the present embodiment has a passing characteristic (see FIG. 2(a)) about equal to the balance characteristic (see FIG. 18(a)) of the above-mentioned conventional surface acoustic wave filter. Thus, the balance characteristic is improved without degrading the passing characteristic.

The surface acoustic wave filter of the present embodiment is remarkably improved in balance characteristic as compared with the above-mentioned conventional surface acoustic wave filter. The following discusses a theoretical examination of the cause of the improved property.

First, it is assumed that the occurrence of parasitic capacitances between the electrodes degrades the balance characteristic of the surface acoustic wave filter.

Figure 3:
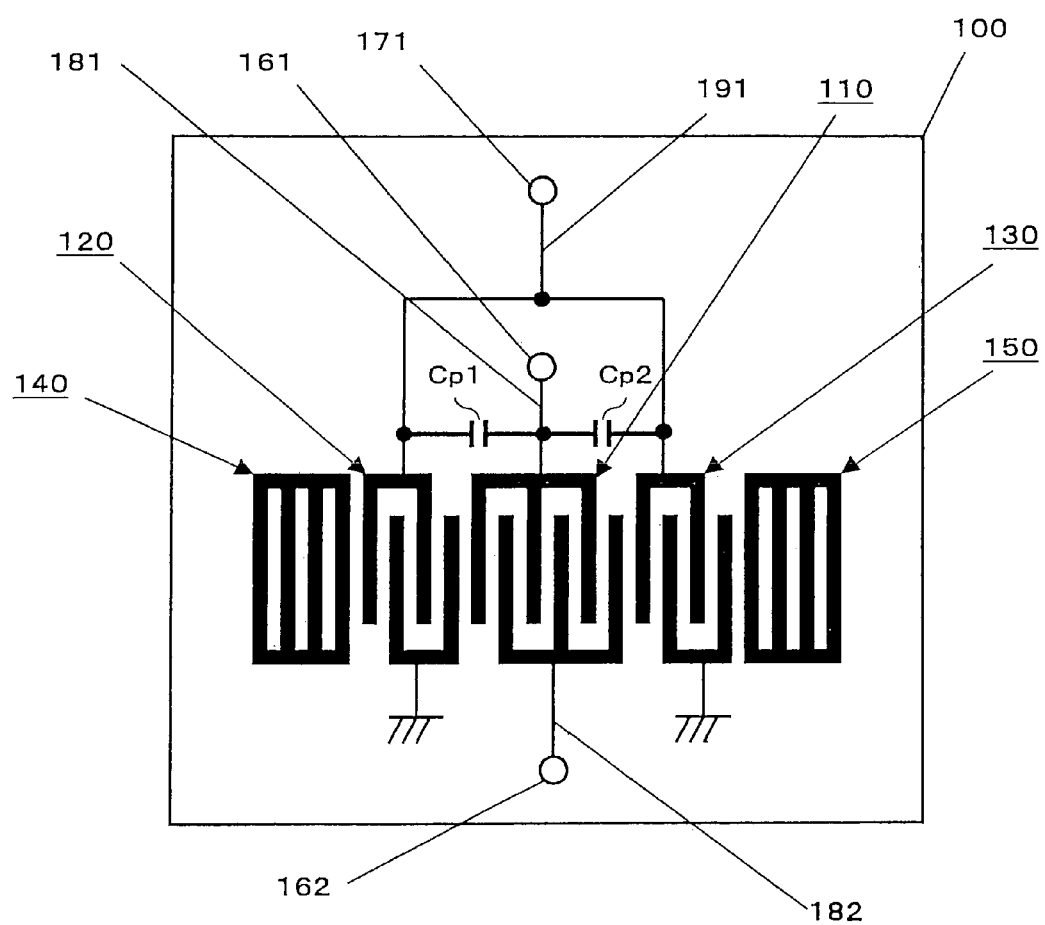
FIG. 3 is a plan view showing a surface acoustic wave filter when the occurrence of parasitic capacitances Cp1 and Cp2 is assumed according to Embodiment 1 of the present invention.

To be more specific, as shown in FIG. 3, it is assumed that the conventional surface acoustic wave filter has parasitic capacitances Cp1 and Cp2 occurring between the connection electrode 181 and the connection electrode 191, whereby the balance characteristic is degraded. Here, FIG. 3 is a plan view showing the surface acoustic wave filter of the Embodiment 1 according to the present invention on the assumption that the parasitic capacitances Cp1 and Cp2 occur.

Figure 4:
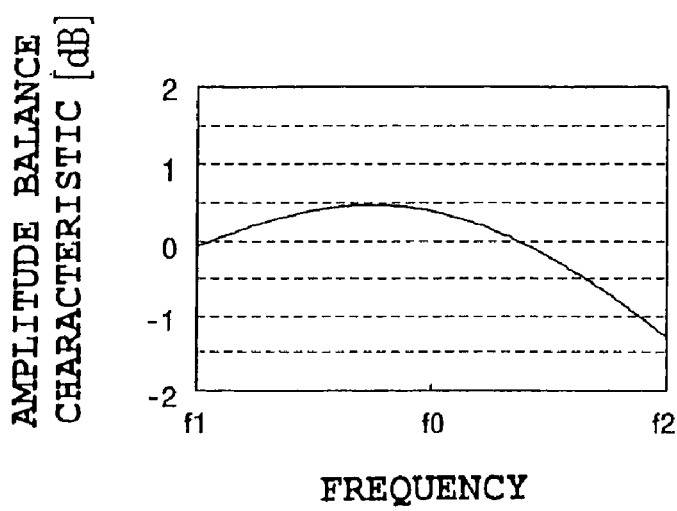
FIG. 4(a) is an explanatory drawing showing the relationship between a frequency and an amplitude balance characteristic of the surface acoustic wave filter when the occurrence of the parasitic capacitances Cp1 and Cp2 is assumed according to Embodiment 1 of the present invention (in the case of parasitic capacitance Cp1=Cp2=0.1 pF)
FIG. 4(b) is an explanatory drawing showing the relationship between a frequency and a phase balance characteristic of the surface acoustic wave filter when the occurrence of the parasitic capacitances Cp1 and Cp2 is assumed according to Embodiment 1 of the present invention (in the case of parasitic capacitance Cp1=Cp2=0.1 pF)
Figure 4:
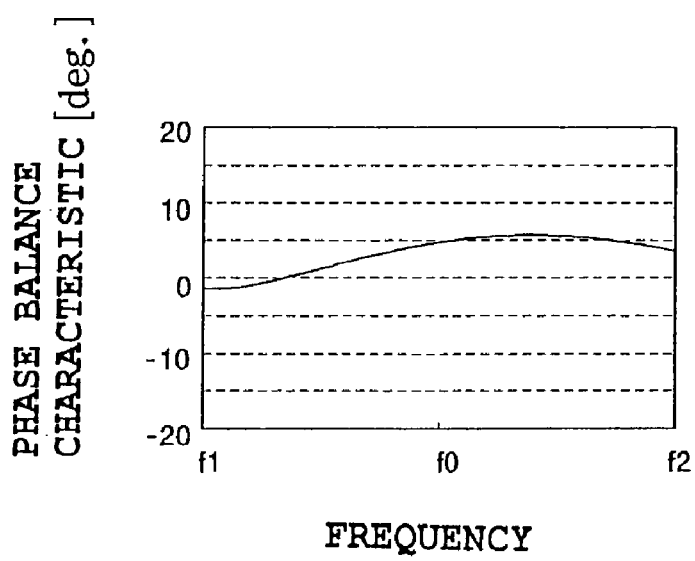

Then, the inventors performed a theoretical simulation related to the surface acoustic wave filter on the assumption that the parasitic capacitances Cp1 and Cp2 occur with the parasitic capacitance Cp1=Cp2=0.1 pF and obtained simulation results shown in FIGS. 4(a) to 4(b). FIG. 4(a) is an explanatory drawing showing the relationship between a frequency and an amplitude balance characteristic of the surface acoustic wave filter (in the case of the parasitic capacitance Cp1=Cp2=0.1 pF) on the assumption that the parasitic capacitances Cp1 and Cp2 occur in Embodiment 1 of the present invention. FIG. 4(b) is an explanatory drawing showing the relationship between a frequency and a phase balance characteristic of the surface acoustic wave filter (in the case of the parasitic capacitance Cp1=Cp2=0.1 pF) on the assumption that the parasitic capacitances Cp1 and Cp2 occur in Embodiment 1 of the present invention.

As shown in FIG. 4(a), regarding the relationship between a frequency and an amplitude balance characteristic of the surface acoustic wave filter on the assumption that the parasitic capacitances Cp1 and Cp2 occur, the surface acoustic wave filter is approximate to that of the conventional surface acoustic wave filter (see FIG. 18(b)) in a preferred manner. Moreover, regarding the relationship between a frequency and a phase balance characteristic of the surface acoustic wave filter on the assumption that the parasitic capacitances Cp1 and Cp2 occur, as shown in FIG. 4(b), the surface acoustic wave filter is approximate to that of the conventional surface acoustic wave filter (see FIG. 18(b)) in a preferred manner.

Hence, it is understood that the above-described assumption is quite accurate that the conventional surface acoustic wave filter is degraded in balance characteristic because of the occurrence of parasitic capacitances between the electrodes.

Further, it became apparent that a dominant cause of degradation of the balance characteristic is the parasitic capacitances Cp1 and Cp2 (see FIG. 3) occurring between the IDT electrode 110 and the IDT electrodes 120 and 130 and between the connection electrode 181 and the connection electrode 191.

Subsequently, it is assumed that the surface acoustic wave filter degrades its balance characteristic as these parasitic capacitances increase.

Figure 5:
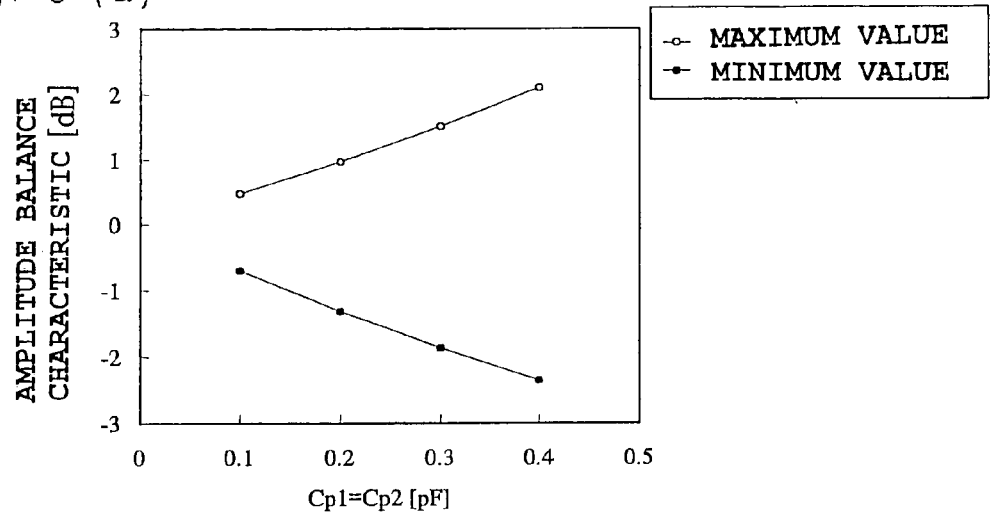
FIG. 5(a) is an explanatory drawing showing the relationship between a maximum value and a minimum value of the parasitic capacitance Cp1=Cp2 and an amplitude balance characteristic according to Embodiment 1 of the present invention.
FIG. 5(b) is an explanatory drawing showing the relationship between a maximum value and a minimum value of the parasitic capacitance Cp1=Cp2 and a phase balance characteristic according to Embodiment 1 of the present invention.
Figure 5:
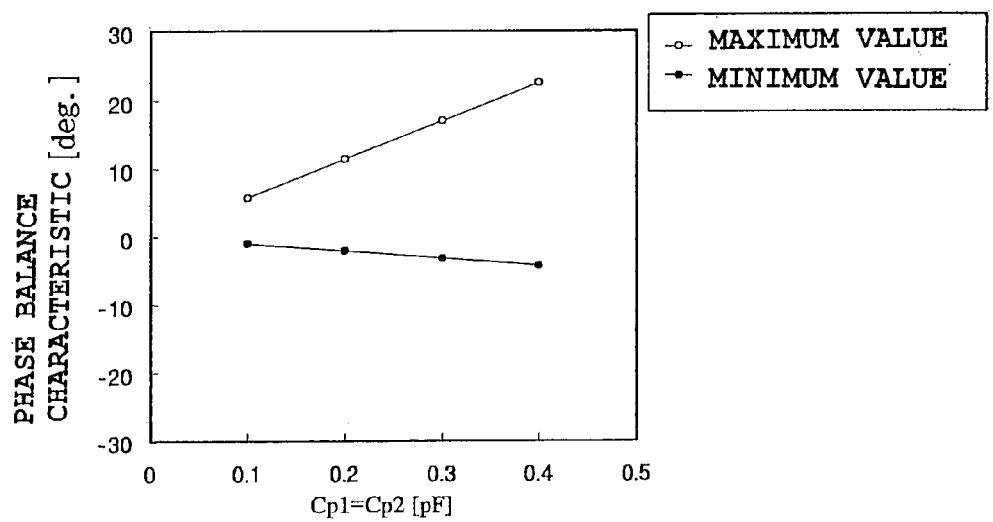

Then, the inventors performed a theoretical simulation related to the surface acoustic wave filter on the assumption that the parasitic capacitances Cp1 and Cp2 occur with the parasitic capacitance Cp1=Cp2 is 0.1, 0.2, 0.3, and 0.4 pF and obtained simulation results shown in FIGS. 5(a) to 5(b). FIG. 5(a) is an explanatory drawing showing the relationship between the parasitic capacitance Cp1=Cp2 and a maximum value and a minimum value of an amplitude balance characteristic according to Embodiment 1 of the present invention, and FIG. 5(b) is an explanatory drawing showing the relationship between the parasitic capacitance Cp1=Cp2 and a maximum value and a minimum value of a phase balance characteristic according to Embodiment 1 of the present invention.

As shown in FIG. 5(a), the relationship between the parasitic capacitance Cp1=Cp2 and a maximum value and a minimum value of an amplitude balance characteristic is that a maximum value increases and a minimum value decreases as the parasitic capacitance Cp1=Cp2 increases. Further, as shown in FIG. 5(b), the relationship between the parasitic capacitance Cp1=Cp2 and a maximum value and a minimum value of a phase balance characteristic is that a maximum value increases and a minimum value decreases as the parasitic capacitance Cp1=Cp2 increases.

Thus, the above assumption appears accurate that the surface acoustic wave filter is degraded in balance characteristic as the parasitic capacitance increases.

Next, it is assumed that it is preferable to form a dielectric thin film between the piezoelectric substrate and the IDT electrodes and the connection electrodes in order to reduce the parasitic capacitances Cp1 and Cp2 to improve the balance characteristic of the surface acoustic wave filter.

Figure 19:
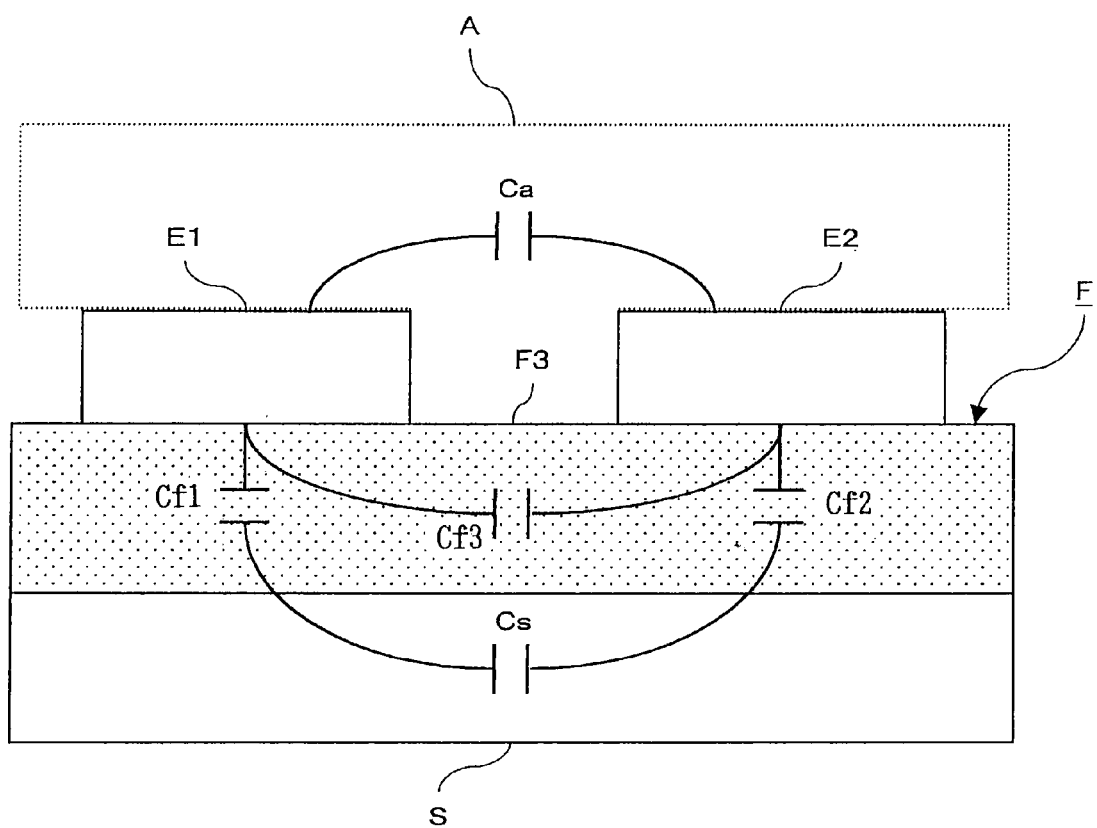
FIG. 19 is an explanatory drawing showing parasitic capacitances when a thin film F is formed between a substrate S and electrodes E1 and E2 according to Embodiment 1 of the present invention.

Then, the inventors made the following assumption about parasitic capacitances occurring between an electrode E1 and an electrode E2 when a thin film F is formed between the electrodes E1 and E2 and a substrate S as shown in FIG. 19. Here, FIG. 19 is an explanatory drawing showing parasitic capacitances when the thin film F is formed between the electrodes E1 and E2 and the substrate S according to Embodiment 1 of the present invention.

Namely, as to a capacitance formed between the electrode E1 and the electrode E2, approximation can be made by a combined capacitance of (1) a series capacitance of a capacitance Cf1 of the thin film F, a capacitance Cs of the substrate S, and a capacitance Cf2 of the thin film F, (2) a capacitance Cf3 of the thin film F, and (3) a capacitance Ca of an air portion A. The combined capacitance is expressed by the following equation.

$$(Cf1^{-1}+Cs^{-1}+Cf2^{-1})^{-1}+Cf3+Ca \quad \text{(Equation 1)}$$

Here, the air portion A on the electrodes E1 and E2 is considered as a free space.

Figure 20:
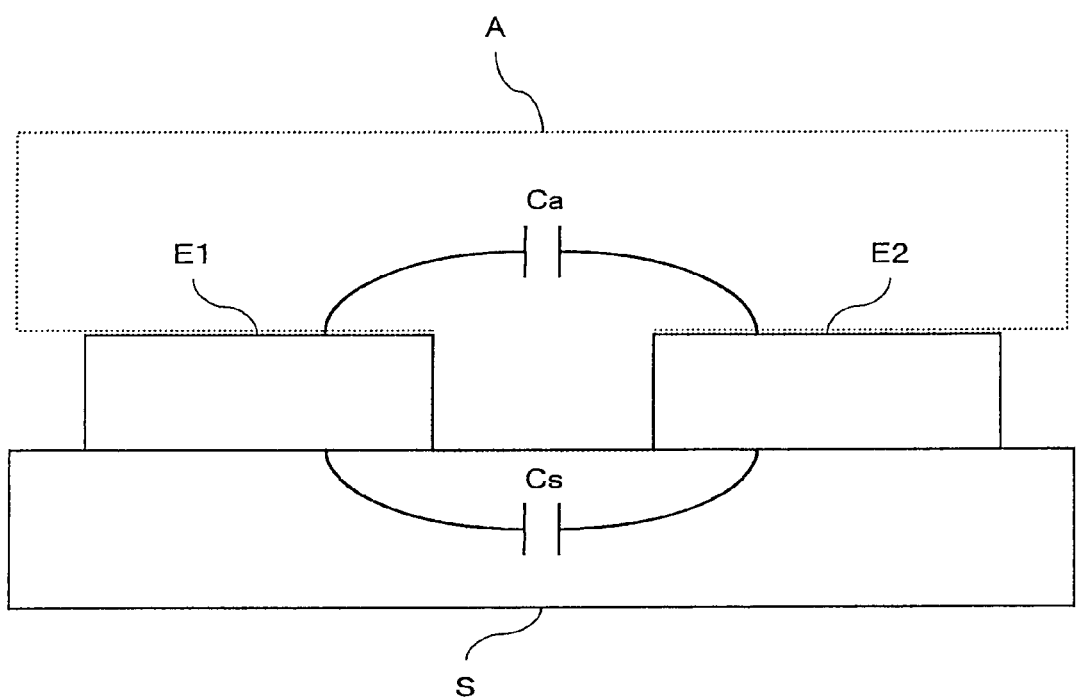
FIG. 20 is an explanatory drawing showing parasitic capacitances when the thin film F is not formed between the substrate S and the electrodes E1 and E2 according to Embodiment 1 of the present invention.

Further, the inventor made the following assumption about parasitic capacitances occurring between the electrode E1 and an electrode E2 when the thin film F is not formed between the substrate S and the electrodes E1 and E2 as shown in FIG. 20. Here, FIG. 20 is an explanatory drawing showing parasitic capacitances when the thin film F is not formed between the substrate S and the electrodes E1 and E2 according to Embodiment 1 of the present invention.

Namely, as to a capacitance formed between the electrode E1 and the electrode E2, approximation can be made by a combined capacitance of (1) a capacitance Cs of the substrate S and (2) a capacitance Ca of the air portion A. The combined capacitance is expressed by the following equation.

$$Cs+Ca \quad \text{(Equation 2)}$$

Therefore, when a permittivity and a thickness of the thin film F are selected so as to satisfy $$(Cf1^{-1}+Cs^{-1}+Cf2^{-1})^{-1}+Cf3<Cs, \quad \text{(Equation 3)}$$

and the thin film F is formed between the substrate S and the electrodes E1 and E2, a capacitance formed between the electrode E1 and the electrode E2 can be smaller as compared with the case where the thin film F is not formed between the substrate S and the electrodes E1 and E2.

Thus, in order to reduce the above parasitic capacitances Cp1 and Cp2 to improve the balance characteristic of the surface acoustic wave filter, the above assumption appears accurate that it is preferable to form the dielectric thin film between the piezoelectric substrate and the IDT electrodes and the connection electrodes.

Since the capacitance Cp1=Cp2 is reduced as the permittivity of the dielectric thin film decreases (see Equation 1), the balance characteristic of the surface acoustic wave filter can be improved. Thus, also when the piezoelectric substrate is formed using a substance of high dielectric constant such as lithium tantalate instead of a substance of low dielectric constant such as crystal, the balance characteristic can be improved by using a dielectric thin film having a lower dielectric constant. Besides, in consideration of a coupling coefficient of the piezoelectric substrate S, the thickness of the thin film F needs to be selected so as to obtain a preferred filter characteristic in a frequency band to be handled and respond to a wider frequency band of the near future.

Figure 6:
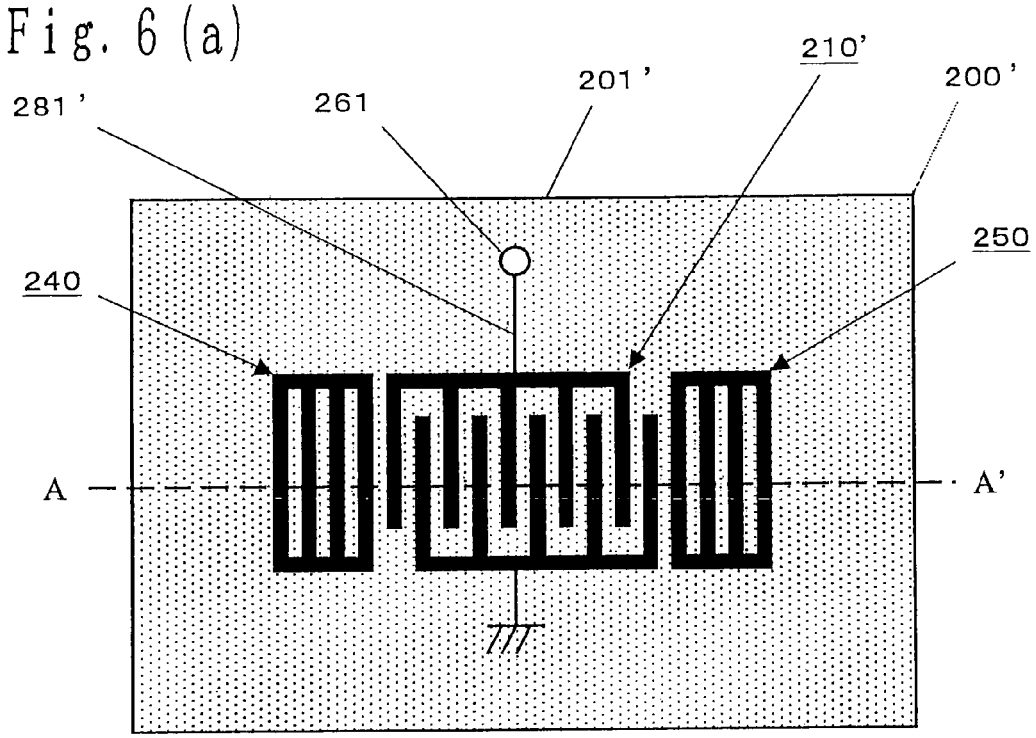
FIG. 6(a) is a plan view showing a resonator according to Embodiment 1 of the present invention.
FIG. 6(b) is a sectional view showing the resonator taken along line A–A' according to Embodiment 1 of the present invention.
Figure 6:
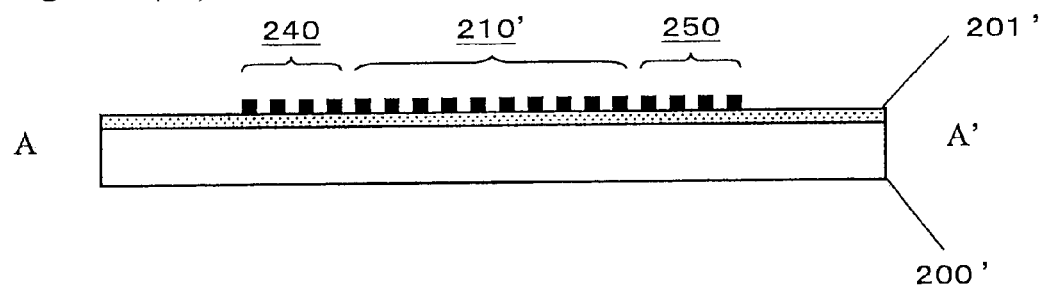
Figure 7:
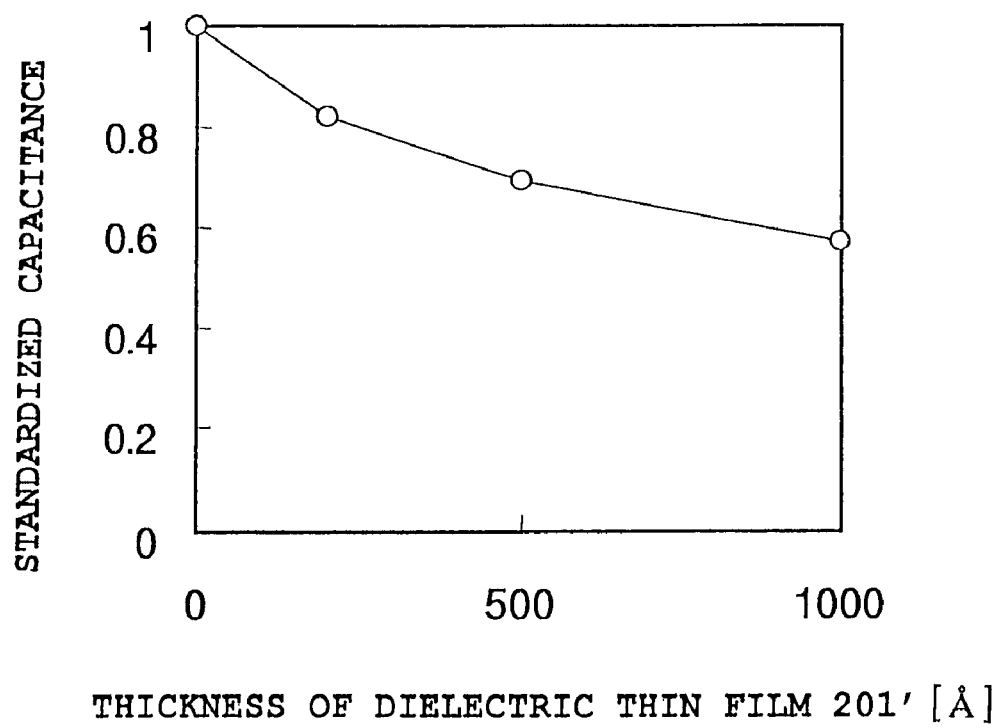
FIG. 7 is an explanatory drawing showing the relationship between a film thickness and a standardized capacitance of the resonator according to Embodiment 1 of the present invention.

In order to support the above theoretical examination by experiment, the inventors inspected a capacitance characteristic of a resonator in which a dielectric thin film 201' is formed between a piezoelectric substrate 200' and IDT electrodes 210' and connection electrodes 281' as shown in FIGS. 6(a) and 6(b) (here, when the dielectric thin film 201' is 0 Å in thickness, the dielectric thin film 201' is not formed), and thereby the capacitance characteristic of FIG. 7 was obtained. Besides, FIG. 6(a) is a plan view showing the resonator according to Embodiment 1 of the present invention, and FIG. 6(b) is a sectional view showing the resonator taken along line A–A' according to Embodiment 1 of the present invention. Moreover, FIG. 7 is an explanatory drawing showing the relationship between a thickness and a standardized capacitance of the resonator according to Embodiment 1 of the present invention.

In this way, it was proved by experiment that the formation of the dielectric thin film can reduce the capacitance and improve the balance characteristic.

Additionally, although a standardized thickness was about 0.5% in the present embodiment, a thickness other than the standardized thickness is also applicable.

EMBODIMENT 2

Figure 8:
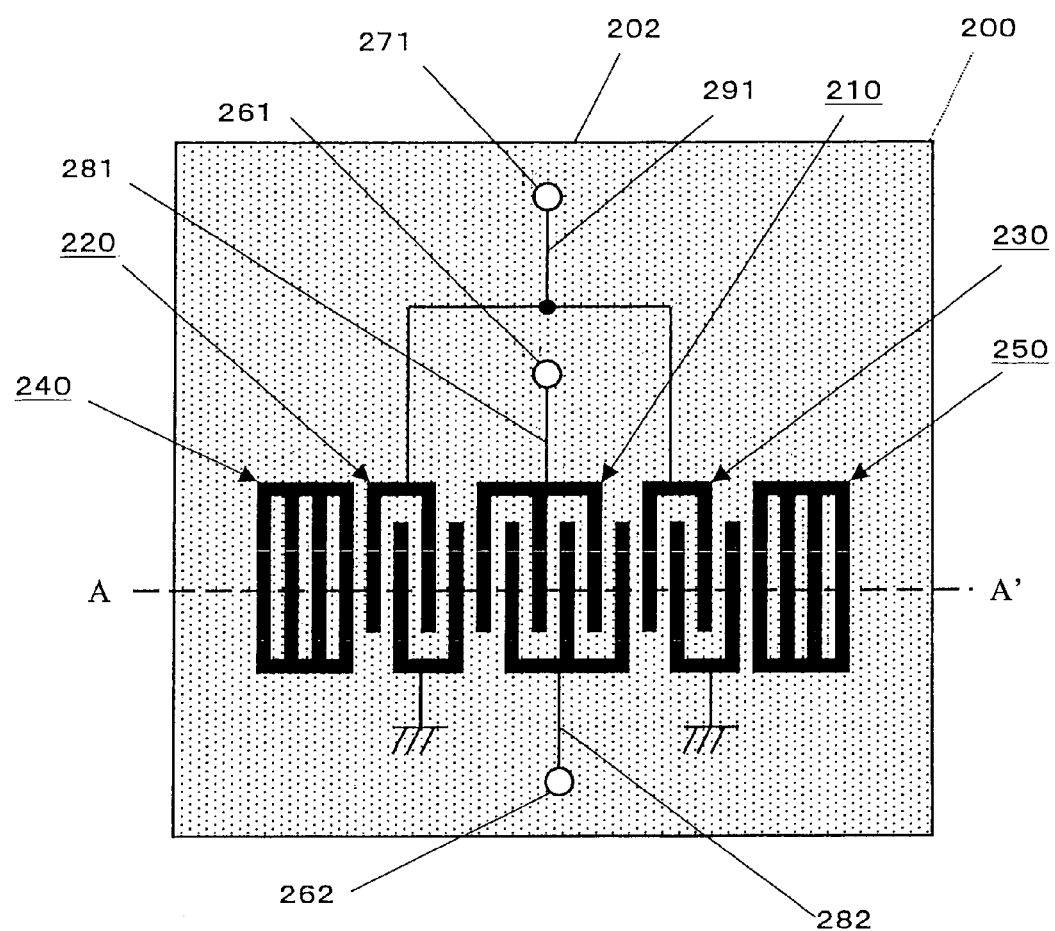
FIG. 8 is a plan view showing a surface acoustic wave filter according to Embodiment 2 of the present invention.
Figure 9:
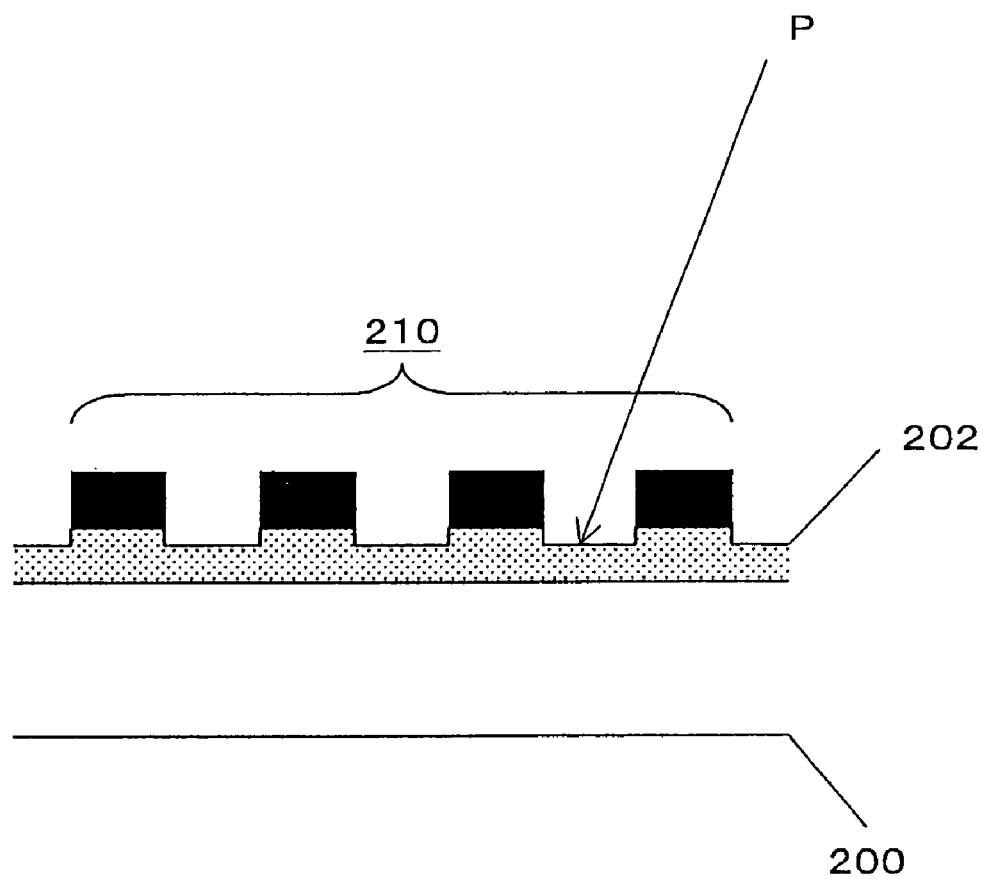
FIG. 9 is a partially enlarged sectional view showing the surface acoustic wave filter according to Embodiment 2 of the present invention.

First, referring to FIGS. 8 and 9, the following will discuss the configuration of a surface acoustic wave filter according to the present embodiment. Here, FIG. 8 is a plan view showing the surface acoustic wave filter according to Embodiment 2 of the present invention. Further, FIG. 9 is a partially enlarged sectional view showing the surface acoustic wave filter according to Embodiment 2 of the present invention.

As shown in FIGS. 8 and 9, the surface acoustic wave filter of the present embodiment is a surface acoustic wave filter of longitudinally coupled mode type that comprises a piezoelectric substrate 200, IDT electrodes 210 connected to balanced type terminals 261 and 262, IDT electrodes 220 connected to an unbalanced type terminal 271, IDT electrodes 230 connected to the unbalanced type terminal 271, a connection electrode 281 of connecting the IDT electrode 210 to the balanced type terminal 261, a connection electrode 282 of connecting the IDT electrode 210 to the balanced type terminal 262, a connection electrode 291 of connecting the IDT electrodes 220 and 230 to the unbalanced type terminal 271, a dielectric thin film 202 formed like a plane between the piezoelectric substrate 200 and the IDT electrodes 210, 220, and 230 and the connection electrodes 281, 282, and 291, and reflector electrodes 240 and 250.

Further, the dielectric thin film 202 corresponds to a dielectric thin film of the present invention.

The surface acoustic wave filter of the present embodiment is similar in configuration to the surface acoustic wave filter of Embodiment 1 (see FIGS. 1(a) and 1(b)).

Here, as shown in FIG. 9, the surface acoustic wave filter of the present embodiment is characterized by comprising the dielectric thin film 202 which undergoes over etching when etching is performed on parts such as P between electrode fingers of the IDT electrode 210, the parts not being provided under the IDT electrodes 210, 220, 230, and the connection electrodes 281, 282, and 291.

The dielectric thin film 202 is a thin film which is made of silicon nitride having an effective relative dielectric constant of about 10 and is formed like a plane on the piezoelectric substrate 200 (see FIG. 9). The dielectric thin film 202 is formed by a sputtering method.

The surface acoustic wave filter of the present embodiment performs the same operation as the surface acoustic wave filter of the Embodiment 1.

As with the surface acoustic wave filter of Embodiment 1, the surface acoustic wave filter of the present embodiment has a more preferable balance characteristic as compared with the conventional surface acoustic wave filter.

EMBODIMENT 3

Figure 10:
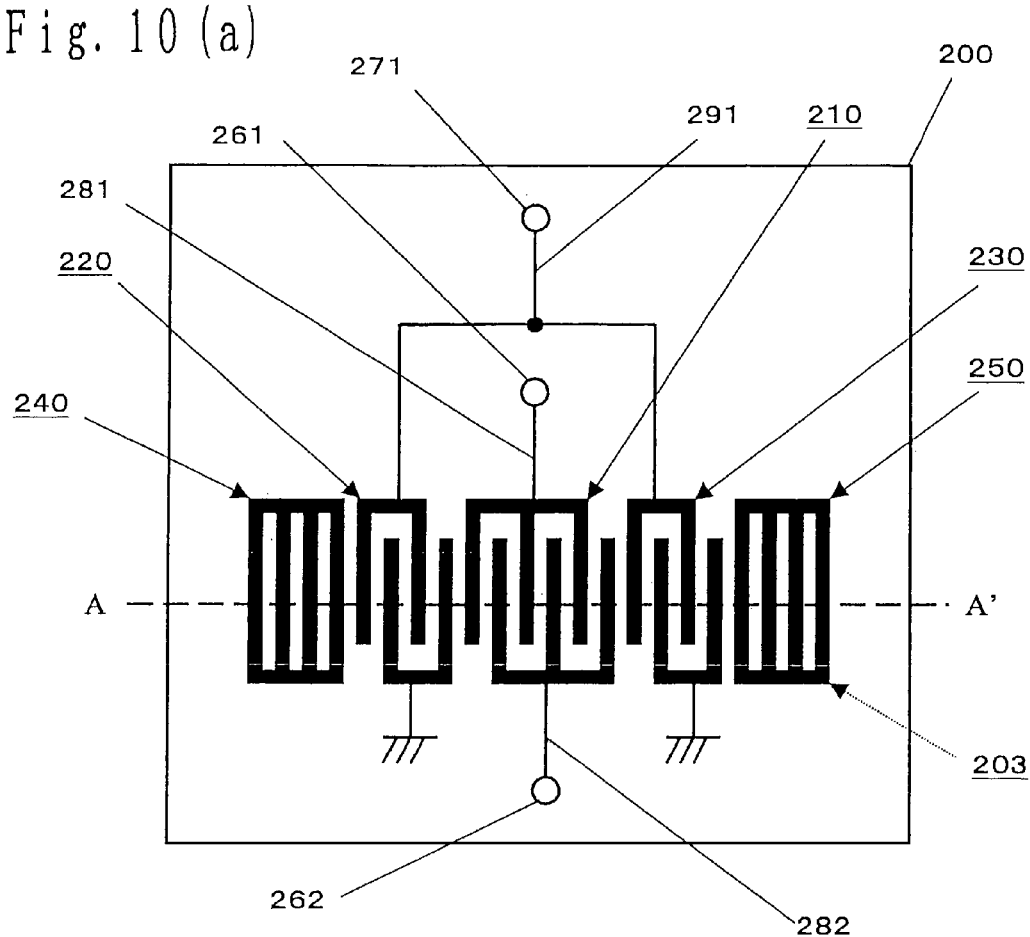
FIG. 10(a) is a plan view showing a surface acoustic wave filter according to Embodiment 3 of the present invention.
FIG. 10(b) is a sectional view showing the surface acoustic wave filter taken along line A–A' according to Embodiment 3 of the present invention.
Figure 10:
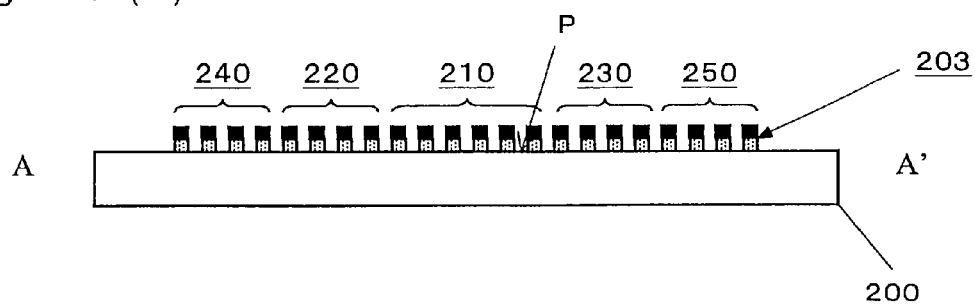

First, referring to FIGS. 10(a) and 10(b), the following will discuss the configuration of the surface acoustic wave filter according to the present embodiment. Here, FIG. 10(a) is a plan view showing the surface acoustic wave filter according to Embodiment 3 of the present invention, and FIG. 10(b) is a sectional view showing the surface acoustic wave filter taken along line A–A' according to Embodiment 3 of the present invention.

As shown in FIGS. 10(a) and 10(b), the surface acoustic wave filter of the present embodiment is a surface acoustic wave filter of longitudinally coupled mode type that comprises a piezoelectric substrate 200, IDT electrodes 210 connected to balanced type terminals 261 and 262, IDT electrodes 220 connected to an unbalanced type terminals 271, IDT electrodes 230 connected to the unbalanced type terminal 271, a connection electrode 281 of connecting the IDT electrode 210 to the balanced type terminal 261, a connection electrode 282 of connecting the IDT electrode 210 to the balanced type terminal 262, a connection electrode 291 of connecting the IDT electrodes 220 and 230 to the unbalanced type terminal 271, a dielectric thin film 203 formed between the piezoelectric substrate 200 and the IDT electrodes 210, 220, and 230, and reflector electrodes 240 and 250.

Further, the dielectric thin film 203 corresponds to a dielectric thin film of the present invention.

The surface acoustic wave filter of the present embodiment is similar in configuration to the surface acoustic wave filter of Embodiment 1 (see FIGS. 1(a) and 1(b)).

As shown in FIG. 10(b), the surface acoustic wave filter of the present embodiment is characterized by comprising the dielectric thin film 203 which is not formed on parts such as P between electrode fingers of the IDT electrode 210, the parts not being provided under the IDT electrodes 210, 220, and 230, but the dielectric thin film 203 is formed only under the IDT electrodes 210, 220, and 230.

The dielectric thin film 203 is a thin film which is made of silicon nitride having an effective relative dielectric constant of about 10 and is formed on the piezoelectric substrate 200 (see FIG. 10(b)). The dielectric thin film 203 is formed by a sputtering method.

The surface acoustic wave filter of the present embodiment performs the same operation as the surface acoustic wave filter of the Embodiment 1.

In the surface acoustic wave filter of the present embodiment, since the dielectric thin film 204 is formed on parts under the IDT electrodes 210, 220, 230, and so on, the capacitance components of the IDT electrodes 210, 220, and 230 are reduced, thereby achieving a preferred balance characteristic as with the surface acoustic wave filter of Embodiment 1.

EMBODIMENT 4

Figure 11:
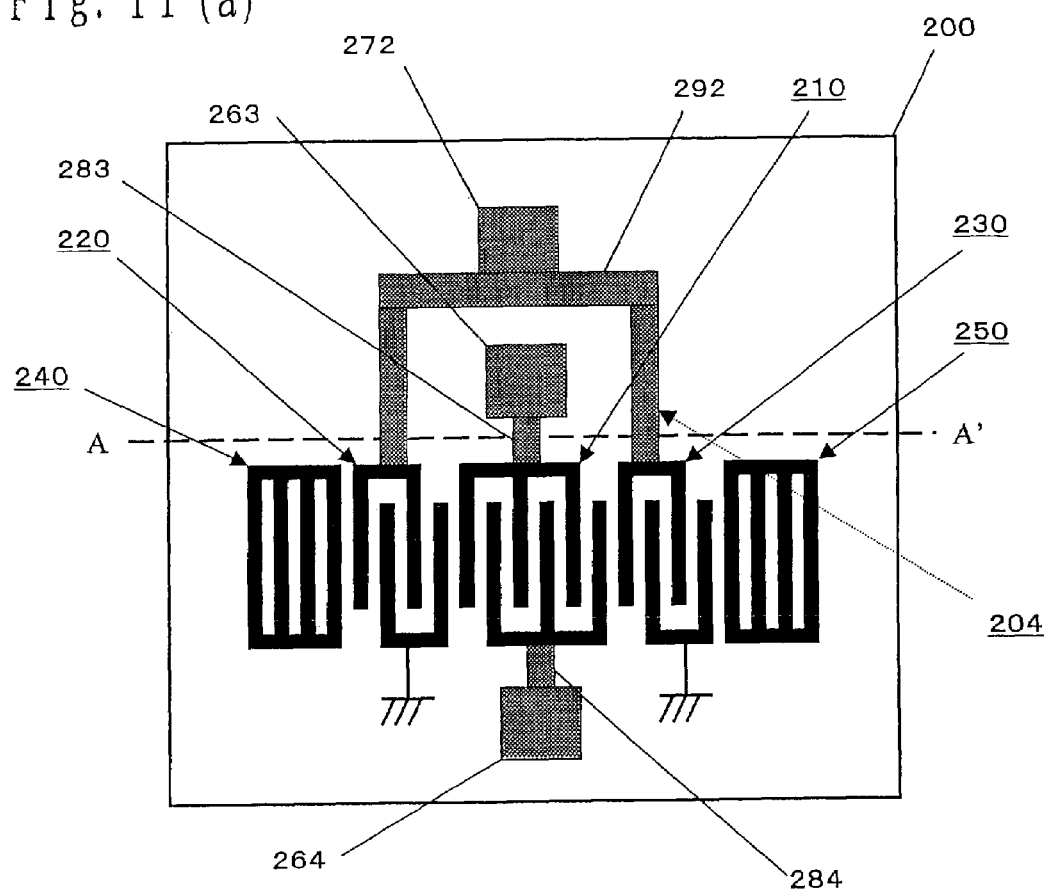
FIG. 11(a) is a plan view showing a surface acoustic wave filter according to Embodiment 4 of the present invention.
FIG. 11(b) is a sectional view showing the surface acoustic wave filter taken along line A–A' according to Embodiment 4 of the present invention.
Figure 11:
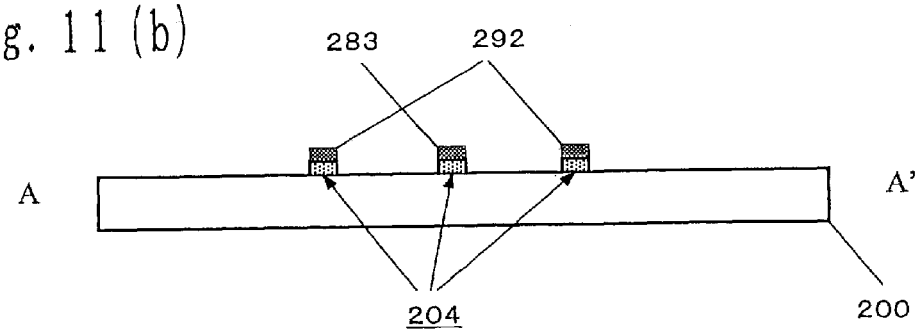

First, referring to FIGS. 11(a) and 11(b), the following will discuss the configuration of a surface acoustic wave filter according to the present embodiment. Here, FIG. 11(a) is a plan view showing the surface acoustic wave filter according to Embodiment 4 of the present invention, and FIG. 11(b) is a sectional view showing the surface acoustic wave filter taken along line A–A' according to Embodiment 4 of the present invention.

As shown in FIG. 11(b), the surface acoustic wave filter of the present embodiment is a surface acoustic wave filter of longitudinally coupled mode type that comprises a piezoelectric substrate 200, IDT electrodes 210 connected to balanced type terminal pad electrodes 263 and 264, IDT electrodes 220 connected to an unbalanced type terminal pad electrode 272, IDT electrodes 230 connected to the unbalanced type terminal pad electrode 272, a connection electrode 283 of connecting the IDT electrode 210 to the balanced type terminal pad electrode 263, a connection electrode 284 of connecting the IDT electrode 210 to the balanced type terminal pad electrode 264, a connection electrode 292 of connecting the IDT electrodes 220 and 230 to the unbalanced type terminal pad electrode 272, a dielectric thin film 204 formed between the piezoelectric substrate 200 and the connection electrodes 283, 284, and 292, and reflector electrodes 240 and 250.

Besides, the connection electrodes 283 and 284 correspond to a first connection electrode of the present invention, the connection electrode 292 corresponds to a second connection electrode of the present invention, and the dielectric thin film 204 corresponds to a dielectric thin film of the present invention. Further, the balanced type terminal pad electrodes 263 and 264 correspond to a balanced type terminal of the present invention, and the unbalanced type terminal pad electrode 272 corresponds to an unbalanced type terminal of the present invention.

The surface acoustic wave filter of the present embodiment is similar in configuration to the surface acoustic wave filter of Embodiment 1 (see FIGS. 1(a) and 1(b)).

As shown in FIGS. 11(a) and 11(b), the surface acoustic wave filter of the present embodiment is characterized by comprising the dielectric thin film 204 which is not formed on parts under the IDT electrodes 210, 220, and 230 and so on, but is formed only under the connection electrodes 283, 284, and 292.

The dielectric thin film 204 is a thin film which is made of silicon nitride having an effective relative dielectric constant of about 10 and is formed on the piezoelectric substrate 200 (see FIG. 10(b)). The dielectric thin film 204 is formed by a sputtering method.

The connection electrode 283 is an electrode which is formed like a line on the dielectric thin film 204 and is constituted by a metallic thin film of an aluminum alloy having a low resistance.

As with the connection electrode 283, the connection electrode 284 is an electrode which is formed like a line on the dielectric thin film 204 and is constituted by a metallic thin film of an aluminum alloy having a low resistance.

As with the connection electrode 283, the connection electrode 292 is an electrode which is formed like a line on the dielectric thin film 204 and is constituted by a metallic thin film of an aluminum alloy having a low resistance.

The balanced type terminal pad electrodes 263 and 264 are leading electrodes during wire packaging or facedown mounting.

As with the balanced type terminal pad electrodes 263 and 264, the unbalanced type terminal pad electrode 272 is a leading electrode during wire bonding or facedown mounting.

The surface acoustic wave filter of the present embodiment performs the same operation as the surface acoustic wave filter of Embodiment 2.

In the surface acoustic wave filter of the present embodiment, since the dielectric thin film 204 is formed on parts under the connection electrodes 283, 284, and 292, the balanced type terminal pad electrodes 263 and 264, the unbalanced type terminal pad electrode 272, and so on, the capacitance components of the connection electrodes 283, 284, and 292, the balanced type terminal pad electrodes 263 and 264, and the unbalanced type terminal pad electrode 272 are reduced, thereby achieving a preferred balance characteristic as with the surface acoustic wave filter of Embodiment 1.

EMBODIMENT 5

Figure 12:
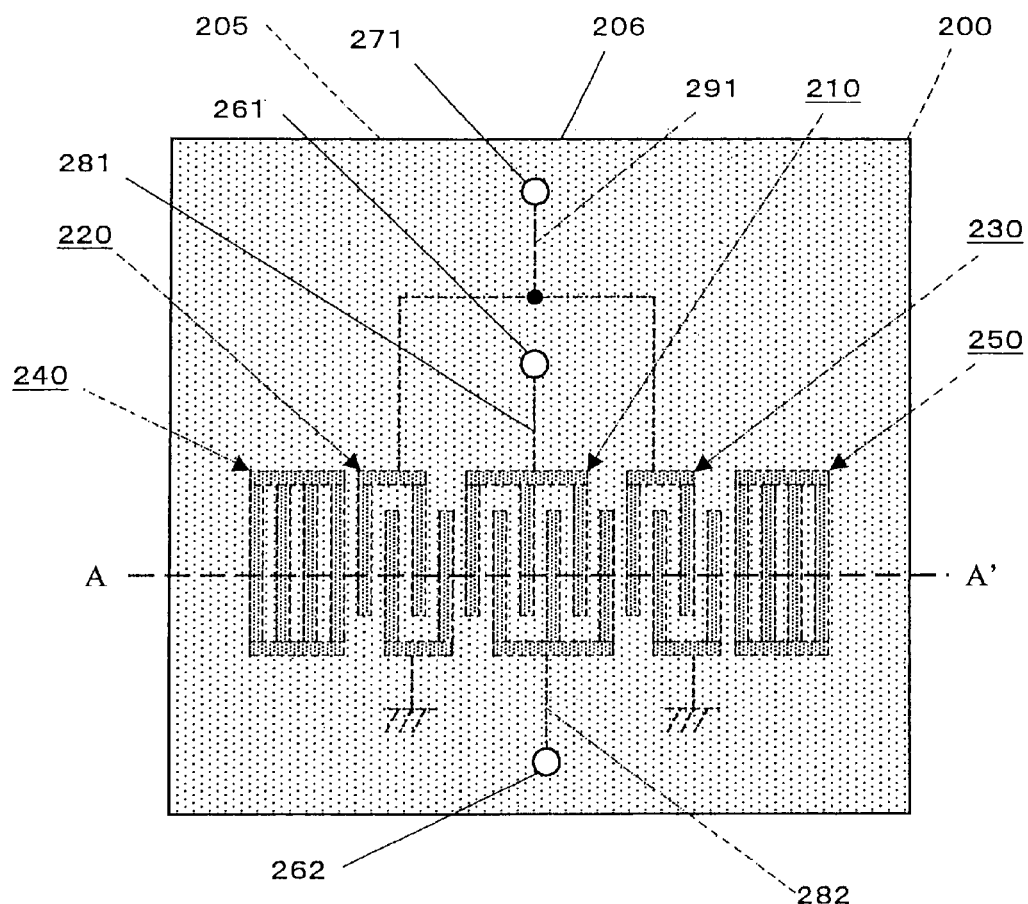
FIG. 12(a) is a plan view showing a surface acoustic wave filter according to Embodiment 5 of the present invention.
FIG. 12(b) is a sectional view showing the surface acoustic wave filter taken along line A–A' according to Embodiment 5 of the present invention.
Figure 12:
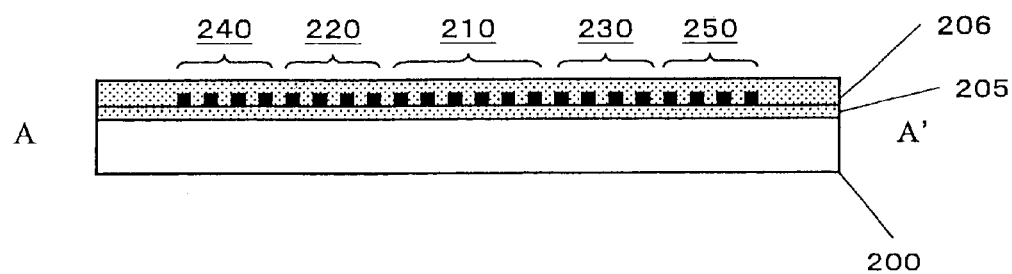

First, referring to FIGS. 12(a) and 12(b), the following will discuss the configuration of a surface acoustic wave filter of the present embodiment. Here, FIG. 12(a) is a plan view showing the surface acoustic wave filter according to Embodiment 5 of the present invention, and FIG. 12(b) is a sectional view showing the surface acoustic wave filter taken along line A–A' according to Embodiment 5 of the present invention.

As shown in FIGS. 12(a) and 12(b), the surface acoustic wave filter of the present embodiment is a surface acoustic wave filter of longitudinally coupled mode type that comprises a piezoelectric substrate 200, IDT electrodes 210 connected to balanced type terminals 261 and 262, IDT electrodes 220 connected to an unbalanced type terminal 271, IDT electrodes 230 connected to the unbalanced type terminal 271, a connection electrode 281 of connecting the IDT electrode 210 to the balanced type terminal 261, a connection electrode 282 of connecting the IDT electrode 210 to the balanced type terminal 262, a connection electrode 291 of connecting the IDT electrodes 220 and 230 to the unbalanced type terminal 271, a dielectric thin film 205 formed like a plane between the piezoelectric substrate 200 and the IDT electrodes 210, 220, and 230, and the connection electrodes 281, 282, and 291, a covering dielectric thin film 206 formed like a plane on the IDT electrodes 210, 220, and 230, and the connection electrodes 281, 282, and 291, and reflector electrodes 240 and 250.

The covering dielectric thin film 206 corresponds to a covering dielectric thin film of the present invention.

The surface acoustic wave filter of the present embodiment is similar in configuration to the surface acoustic wave filter of Embodiment 1 (see FIGS. 1(a) and 1(b)).

However, as shown in FIG. 12(b), the surface acoustic wave filter of the present embodiment comprises the covering dielectric thin film 206 which is formed like a plane on the IDT electrodes 210, 220, and 230, and the connection electrodes 281, 282, and 291.

The dielectric thin film 205 is a thin film which is made of silicon nitride having an effective relative dielectric constant of about 10 and is formed like a plane on the piezoelectric substrate 200 (see FIG. 12(b)). The dielectric thin film 205 is formed by a sputtering method.

The covering dielectric thin film 206 is a thin film which is made of silicon nitride having an effective relative dielectric constant of about 10 and is formed like a plane on the IDT electrodes 210, 220, and 230, the connection electrodes 281, 282, and 291 (see FIG. 12(b)). The covering dielectric thin film 206 is formed by a sputtering method.

The surface acoustic wave filter of the present embodiment performs the same operation as the surface acoustic wave filter of the Embodiment 1.

The surface acoustic wave filter of the present embodiment has a passivation effect, since the covering dielectric thin film 206 is formed on parts provided on the IDT electrodes 210, 220, 230, and the connection electrodes 281, 282, and 291.

EMBODIMENT 6

Figure 13:
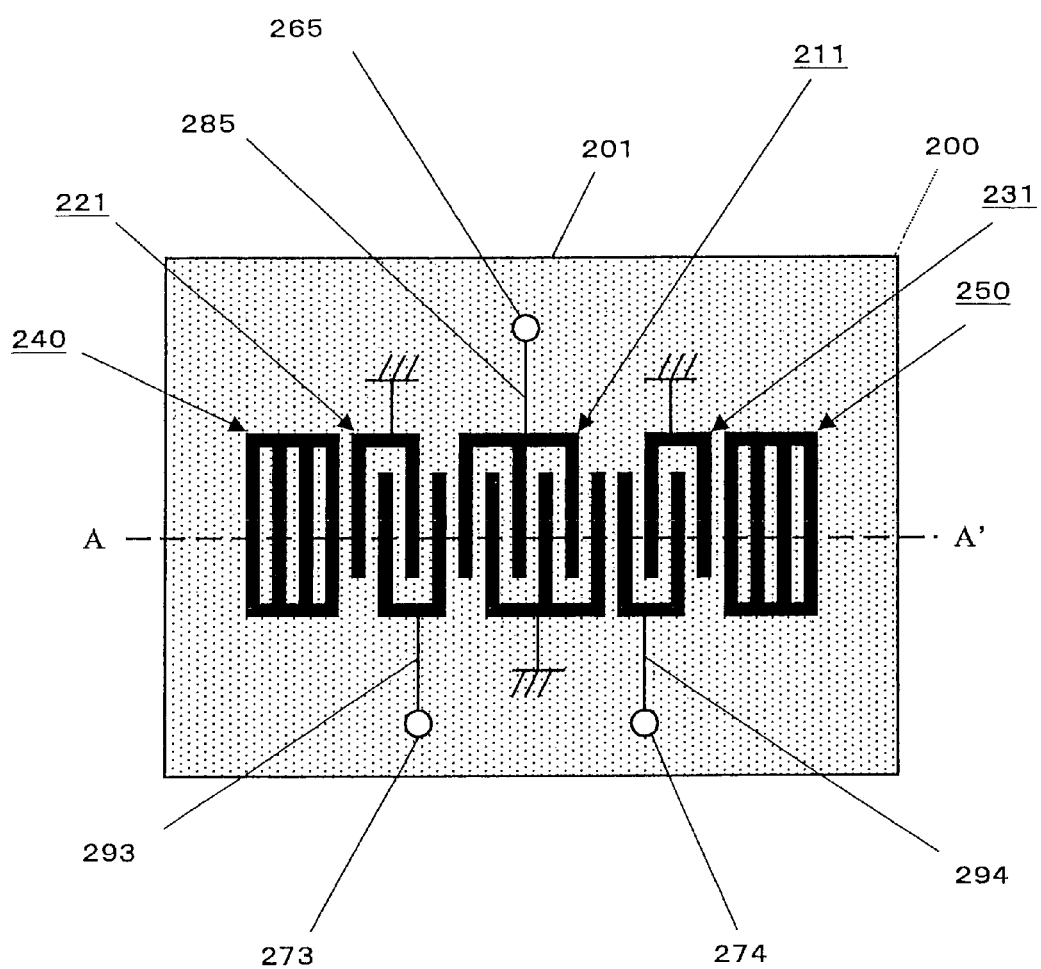
FIG. 13 is a plan view showing a surface acoustic wave filter according to Embodiment 6 of the present invention.

First, referring to FIG. 13, the following will discuss the configuration of a surface acoustic wave filter according to the present embodiment. Here, FIG. 13 is a plan view showing the surface acoustic wave filter according to Embodiment 6 of the present invention.

As shown in FIG. 13, the surface acoustic wave filter of the present embodiment is a surface acoustic wave filter of longitudinally coupled mode type that comprises a piezoelectric substrate 200, IDT electrodes 211 connected to an unbalanced type terminal 265, IDT electrodes 221 connected to a balanced type terminal 273, IDT electrodes 231 connected to a balanced type terminal 274, a connection electrode 285 of connecting the IDT electrode 211 to the unbalanced type terminal 265, a connection electrode 285 of connecting the IDT electrode 211 to the unbalanced type terminal 265, a connection electrode 293 of connecting the IDT electrode 221 to the balanced type terminal 273, a connection electrode 294 of connecting the IDT electrode 231 to the balanced type terminal 274, a dielectric thin film 201 formed like a plane between the piezoelectric substrate 200 and the IDT electrodes 211, 221, and 231, and the connection electrodes 285, 293, and 294, and reflector electrodes 240 and 250.

Here, the IDT electrode 211 corresponds to a second IDT electrode of the present invention, the IDT electrodes 221 and 231 correspond to a first IDT electrode of the present invention, the connection electrode 285 corresponds to a second connection electrode of the present invention, and the connection electrodes 293 and 294 correspond to a first connection electrode of the present invention. Further, the balanced type terminals 273 and 274 correspond to a balanced type terminal of the present invention, and the unbalanced type terminal 265 corresponds to an unbalanced type terminal of the present invention.

The surface acoustic wave filter of the present embodiment is similar in configuration to the surface acoustic wave filter of Embodiment 1 (see FIGS. 1(a) and 1(b)).

However, the surface acoustic wave filter of the present embodiment is characterized by comprising the IDT electrodes 211 connected to the unbalanced type terminal 265, the IDT electrodes 221 connected to the balanced type terminal 273, the IDT electrodes 231 connected to the balanced type terminal 274, the connection electrode 285 of connecting the IDT electrode 211 to the unbalanced type terminal 265, the connection electrode 293 of connecting the IDT electrode 221 to the balanced type terminal 273, and the connection electrode 294 of connecting the IDT electrode 231 to the balanced type terminal 274.

The IDT electrode 211 has a plurality of electrode fingers which are formed like comb teeth on the dielectric thin film 201. These electrode fingers are constituted by metallic thin films of an aluminum alloy having a low resistance. The upper bus bar of the IDT electrode 211 is connected to the balanced type terminal 265 via the connection electrode 285, and the lower bus bar of the IDT electrode 211 is grounded.

The IDT electrode 221 is similar in configuration to the IDT electrode 211 and has a plurality of electrode fingers which are formed like comb teeth on the dielectric thin film 201. These electrode fingers are constituted by metallic thin films of an aluminum alloy having a low resistance. The upper bus bar of the IDT electrode 221 is grounded and the lower bus bar of the IDT electrode 221 is connected to the balanced type terminal 273 via the connection electrode 293.

The IDT electrode 231 is similar in configuration to the IDT electrode 221 and has a plurality of electrode fingers which are formed like comb teeth on the dielectric thin film 201. These electrode fingers are constituted by metallic thin films of an aluminum alloy having a low resistance. The upper bus bar of the IDT electrode 231 is grounded and the lower bus bar of the IDT electrode 231 is connected to the balanced type terminal 274 via the connection electrode 294.

The connection electrodes 285, 293, and 294 are electrodes which are formed on the dielectric thin film 201 to make electrical connection.

The balanced type terminals 273 and 274 are terminals which are used for making connection to a balanced type device such as an amplifier (not shown).

The unbalanced type terminal 265 is a terminal which is used for making connection to an unbalanced type device such as a switch (not shown).

The surface acoustic wave filter of the present embodiment performs the same operation as the surface acoustic wave filter of Embodiment 1.

The surface acoustic wave filter of the present embodiment has a preferred balance characteristic as that of the surface acoustic wave filter of Embodiment 1.

EMBODIMENT 7

Figure 14:
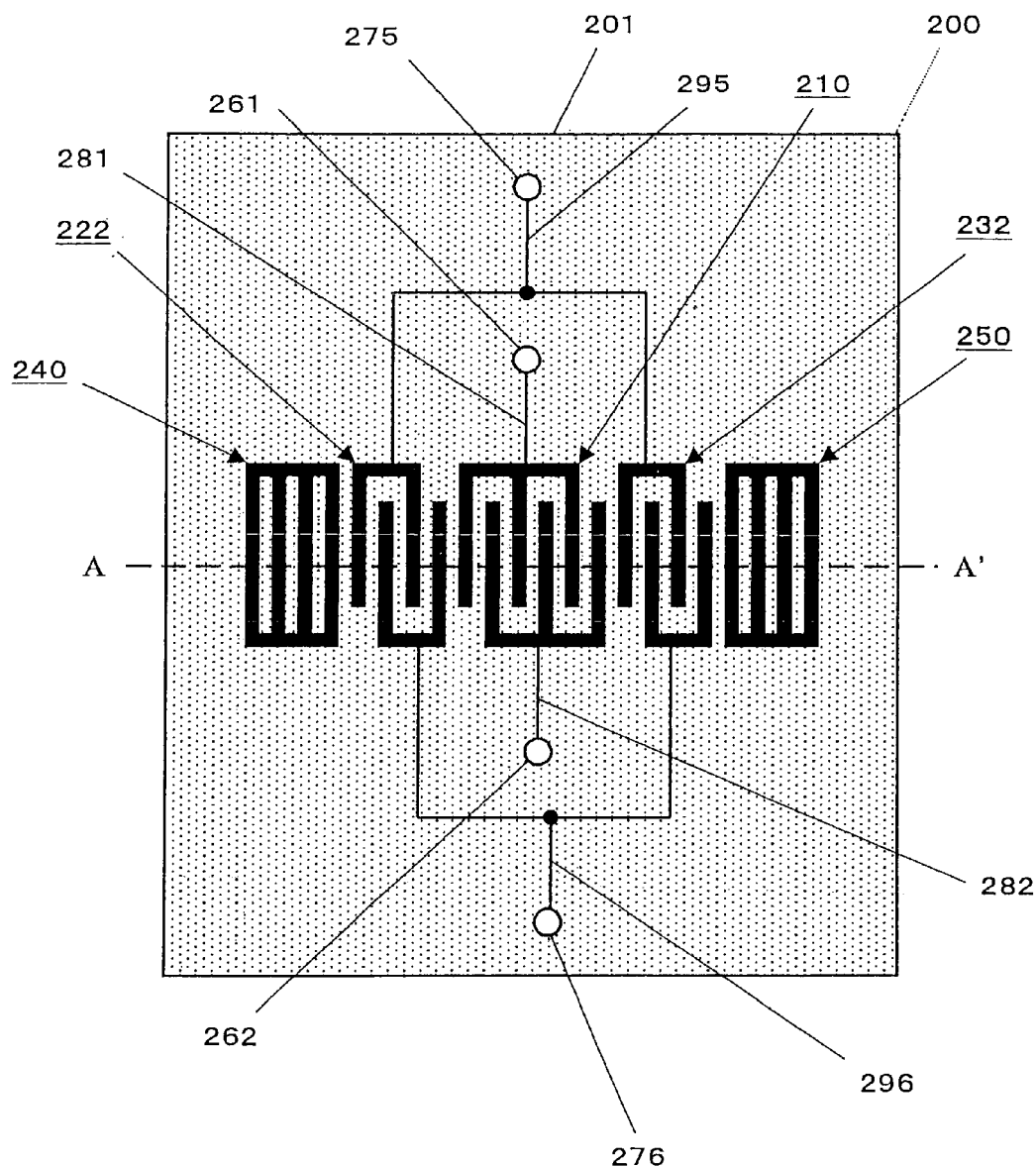
FIG. 14 is a plan view showing a surface acoustic wave filter according to Embodiment 7 of the present invention.

First, referring to FIG. 14, the following will discuss the configuration of the surface acoustic wave filter according to the present embodiment. Here, FIG. 14 is a plan view showing the surface acoustic wave filter according to Embodiment 7 of the present invention.

As shown in FIG. 14, the surface acoustic wave filter of the present embodiment is a surface acoustic wave filter of longitudinally coupled mode type that comprises a piezoelectric substrate 200, IDT electrodes 210 connected to balanced type terminals 261 and 262, IDT electrodes 222 connected to balanced type terminals 275 and 276, IDT electrodes 232 connected to balanced type terminals 275 and 276, a connection electrode 281 of connecting the IDT electrode 210 to the balanced type terminal 261, a connection electrode 282 of connecting the IDT electrode 210 to the balanced type terminal 262, a connection electrode 295 of connecting the IDT electrodes 222 and 232 to the balanced type terminal 275, a connection electrode 296 of connecting the IDT electrodes 222 and 232 to the balanced type terminal 276, a dielectric thin film 201 formed like a plane between the piezoelectric substrate 200 and the IDT electrodes 210, 222, and 232, and the connection electrodes 281, 282, 295, and 296, and reflector electrodes 240 and 250.

Here, the IDT electrodes 222 and 232 correspond to a second IDT electrode of the present invention, and the connection electrodes 295 and 296 correspond to a second connection electrode of the present invention. Further, the balanced type terminals 275 and 276 correspond to a balanced type terminal of the present invention.

The surface acoustic wave filter of the present embodiment is similar in configuration to the surface acoustic wave filter of Embodiment 1 (see FIGS. 1(a) and 1(b)).

However, the surface acoustic wave filter of the present embodiment is characterized by comprising the IDT electrodes 222 connected to the balanced type terminals 275 and 276, the IDT electrodes 232 connected to the balanced type terminals 275 and 276, the connection electrode 295 of connecting the IDT electrodes 222 and 232 to the balanced type terminal 275, and the connection electrode 296 of connecting the IDT electrodes 222 and 232 to the balanced type terminal 276.

The IDT electrode 222 is similar in configuration to the IDT electrode 210 and has a plurality of electrode fingers which are formed like comb teeth on the dielectric thin film 201. These electrode fingers are constituted by metallic thin films of an aluminum alloy having a low resistance. The upper bus bar of the IDT electrode 222 is connected to the balanced type terminal 275 via the connection electrode 295, and the lower bus bar of the IDT electrode 222 is connected to the balanced type terminal 276 via the connection electrode 296.

The IDT electrode 232 is similar in configuration to the IDT electrode 222 and has a plurality of electrode fingers which are formed like comb teeth on the dielectric thin film 201. These electrode fingers are constituted by metallic thin films of an aluminum alloy having a low resistance. The upper bus bar of the IDT electrode 232 is connected to the balanced type terminal 275 via the connection electrode 295, and the lower bus bar of the IDT electrode 232 is connected to the balanced type terminal 276 via the connection electrode 296.

The connection electrodes 295 and 296 are electrodes which are formed on the dielectric thin film 201 to make electrical connection.

The balanced type terminals 275 and 276 are terminals which are used for making connection to a balanced type device such as an amplifier (not shown).

The surface acoustic wave filter of the present embodiment performs the same operation as that of the surface acoustic wave filter of Embodiment 1.

The surface acoustic wave filter of the present embodiment has a preferred balance characteristic as the surface acoustic wave filter of Embodiment 1.

EMBODIMENT 8

Figure 15:
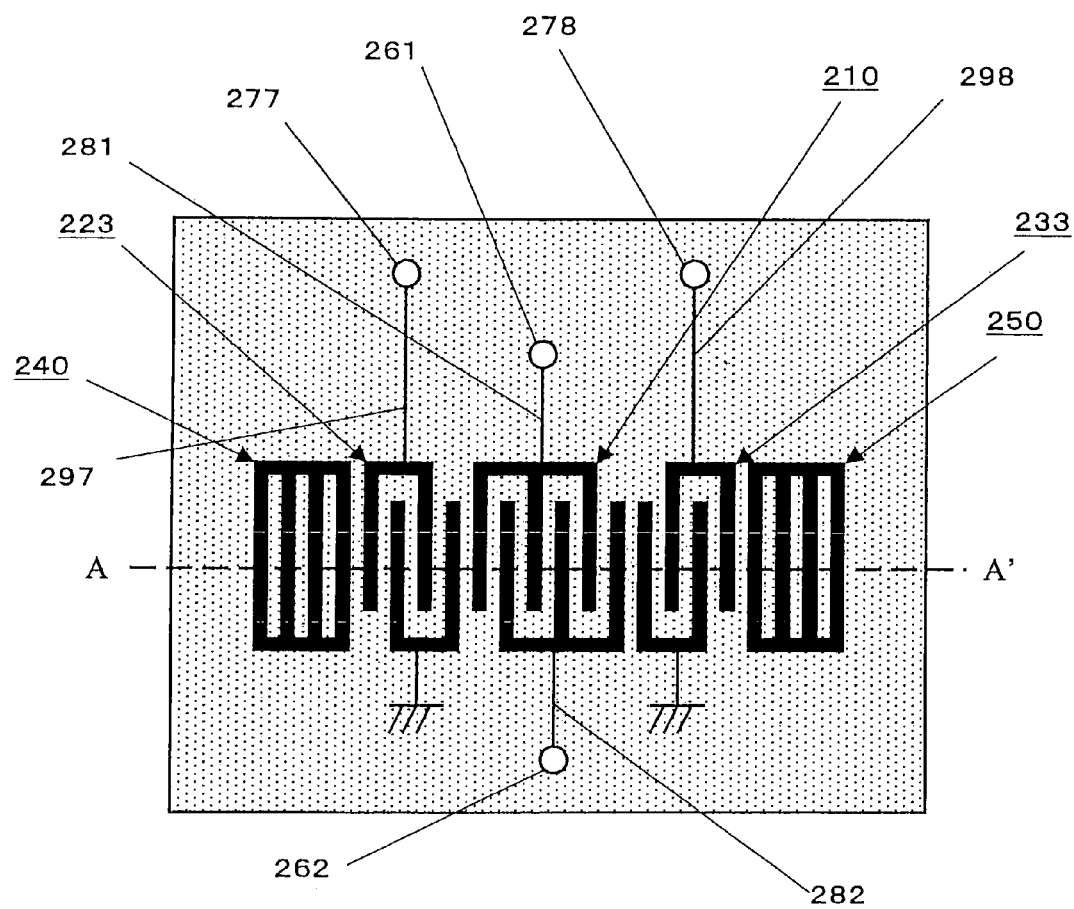
FIG. 15 is a plan view showing a surface acoustic wave filter according to Embodiment 8 of the present invention.

First, referring to FIG. 15, the following discusses the configuration of the surface acoustic wave filter according to the present embodiment. Here, FIG. 15 is a plan view showing the surface acoustic wave filter according to Embodiment 8 of the present invention.

As shown in FIG. 15, the surface acoustic wave filter of the present embodiment is a surface acoustic wave filter of longitudinally coupled mode type that comprises a piezoelectric substrate 200, IDT electrodes 210 connected to balanced type terminals 261 and 262, IDT electrodes 223 connected to a balanced type terminal 277, IDT electrodes 233 connected to a balanced type terminal 278, a connection electrode 281 of connecting the IDT electrode 210 to the balanced type terminal 261, a connection electrode 282 of connecting the IDT electrode 210 to the balanced type terminal 262, a connection electrode 297 of connecting the IDT electrode 223 to the balanced type terminal 277, a connection electrode 298 of connecting the IDT electrodes 233 to the balanced type terminal 278, a dielectric thin film 201 formed like a plane between the piezoelectric substrate 200 and the IDT electrodes 210, 223, and 233, and the connection electrodes 281, 282, 297, and 298, and reflector electrodes 240 and 250.

The IDT electrodes 223 and 233 correspond to a second IDT electrode of the present invention, the connection electrodes 297 and 298 correspond to a second connection electrode of the present invention. Further, the balanced type terminals 277 and 278 correspond to a balanced type terminal of the present invention.

The surface acoustic wave filter of the present embodiment is similar in configuration to the surface acoustic wave filter of Embodiment 1 (see FIGS. 1(a) and 1(b)).

However, the surface acoustic wave filter of the present embodiment comprises the IDT electrodes 223 connected to the balanced type terminal 277, the IDT electrodes 233 connected to the balanced type terminal 278, the connection electrode 297 of connecting the IDT electrode 223 to the balanced type terminal 277, and the connection electrode 298 of connecting the IDT electrode 233 to the balanced type terminal 278.

The IDT electrode 223 is similar in configuration to the IDT electrode 210 and has a plurality of electrode fingers which are formed like comb teeth on the dielectric thin film 201. These electrode fingers are made of metallic thin films of an aluminum alloy having a low resistance. The upper bus bar of the IDT electrode 223 is connected to the balanced type terminal 277 via the connection electrode 297, and the lower bus bar of the IDT electrode 223 is grounded.

The IDT electrode 233 is similar in configuration to the IDT electrode 223 and has a plurality of electrode fingers which are formed like comb teeth on the dielectric thin film 201. These electrode fingers are made of metallic thin films of an aluminum alloy having a low resistance. The upper bus bar of the IDT electrode 233 is connected to the balanced type terminal 278 via the connection electrode 298, and the lower bus bar of the IDT electrode 233 is grounded.

The connection electrodes 297 and 298 are electrodes which are formed on the dielectric thin film 201 to make electrical connection.

The balanced type terminals 277 and 278 are terminals which are used for making connection to a balanced type device such as an amplifier (not shown).

The surface acoustic wave filter of the present embodiment performs the same operation as that of the surface acoustic wave filter of Embodiment 1.

The surface acoustic wave filter of the present embodiment has a preferred balance characteristic as the surface acoustic wave filter of Embodiment 1.

EMBODIMENT 9

Figure 16:
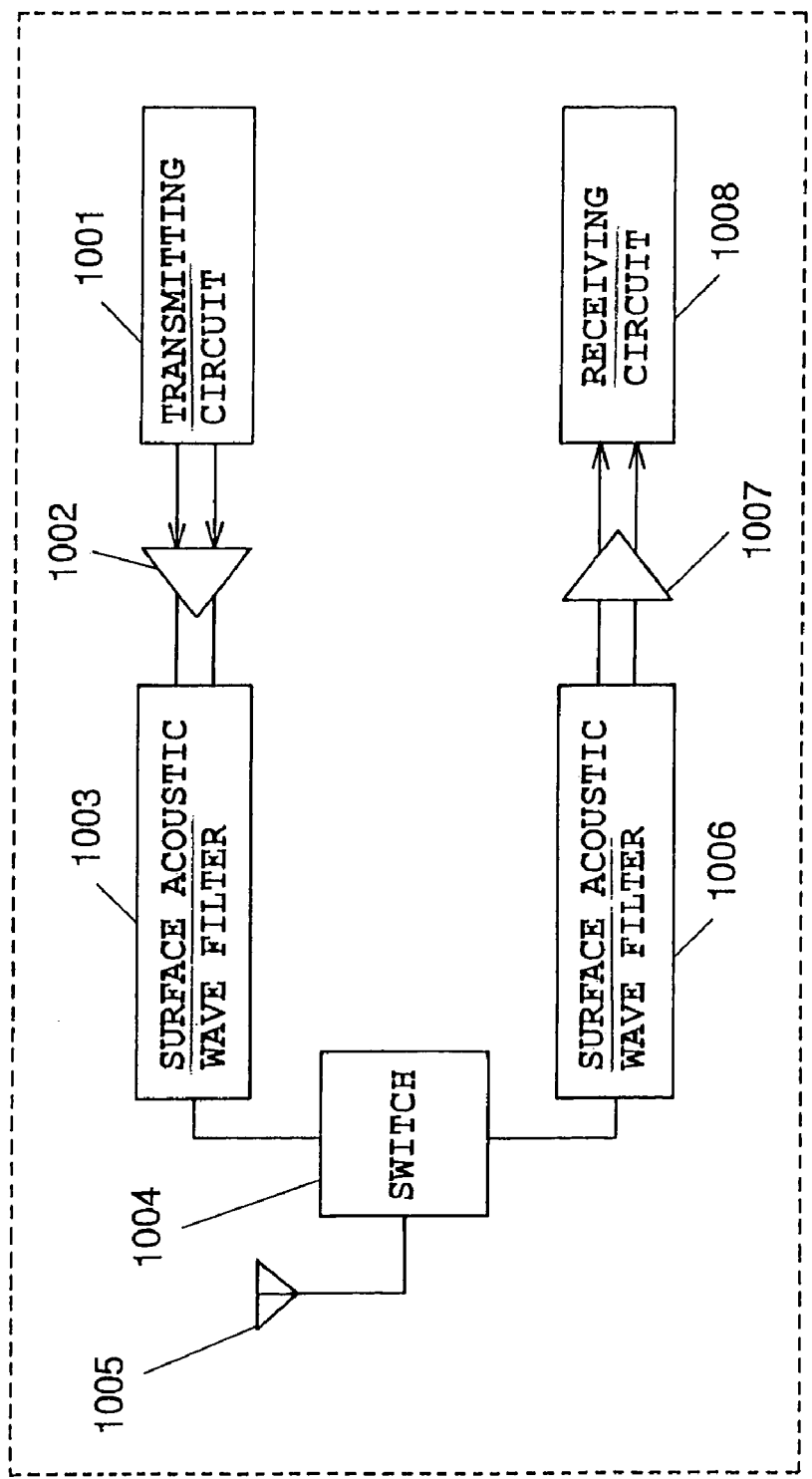
FIG. 16 is a structural diagram showing a communication apparatus according to Embodiment 9 of the present invention.
Figure 17:
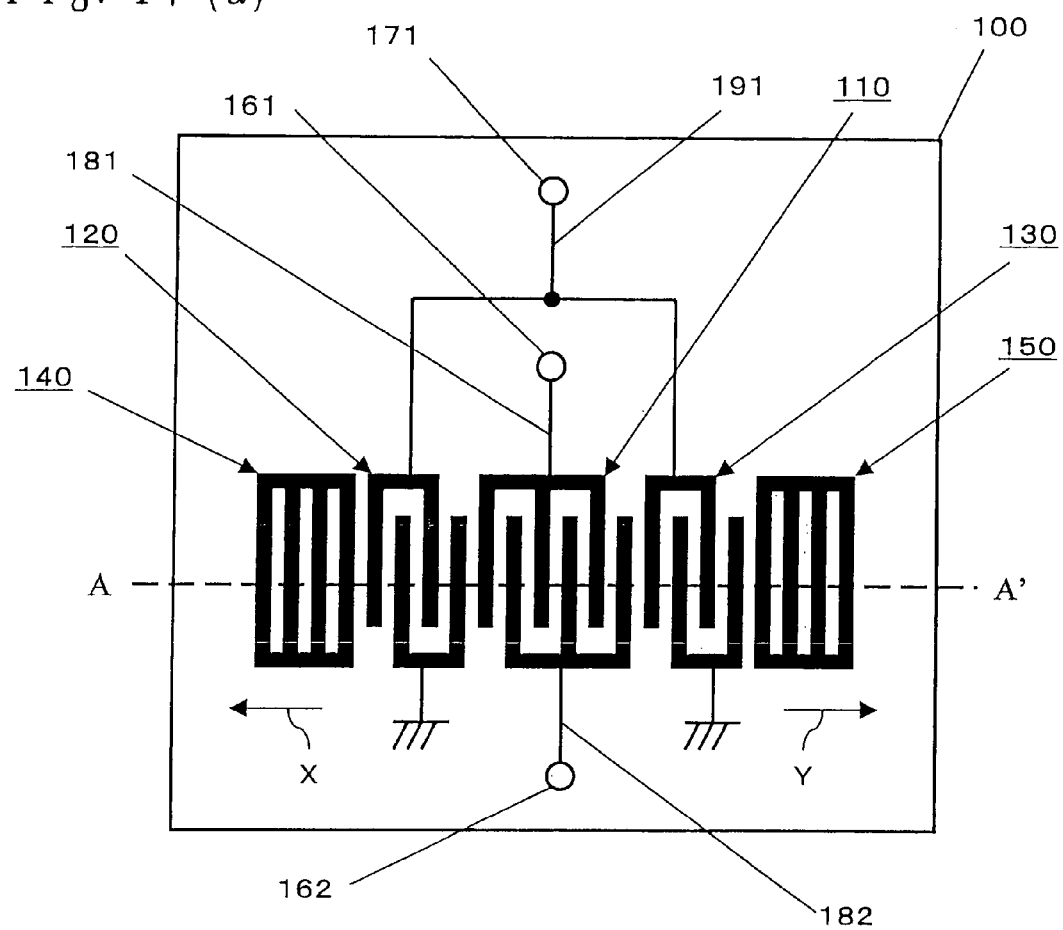
FIG. 17(a) is a plan view showing a conventional surface acoustic wave filter.
FIG. 17(b) is a sectional view showing a conventional surface acoustic wave filter taken along line A–A'.
Figure 17:
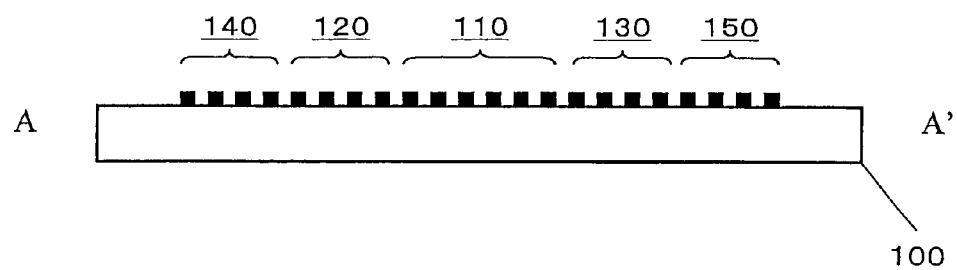

First, mainly referring to FIG. 16 which is a structural diagram showing a communication apparatus according to Embodiment 9 of the present invention, the following will discuss the configuration of the communication apparatus of the present embodiment.

The communication apparatus of the present embodiment comprises a transmitting circuit 1001 for transmission, a receiving circuit 1008 for reception, a surface acoustic wave filter 1003 which filters a transmission signal to be used for transmission, and a surface acoustic wave filter 1006 which filters a reception signal to be used for reception.

Means including the transmitting circuit 1001 and the receiving circuit 1008 corresponds to transmitting and receiving means of the present invention, a transmission amplifier 1002 and a reception amplifier 1007 correspond to a balanced type semiconductor of the present invention, and surface acoustic wave filters 1003 and 1006 correspond to a surface acoustic wave filter of the present invention. Further, means including the transmission amplifier 1002, the reception amplifier 1007, and the surface acoustic wave filters 1003 and 1006 correspond to a balanced type circuit of the present invention.

The transmitting circuit 1001 is a circuit of transmitting a transmission signal from an antenna 1005 via the transmission amplifier 1002, the surface acoustic wave filter 1003, and a switch 1004.

The receiving circuit 1008 is a circuit of inputting a reception signal, which is received from the antenna 1005, via the switch 1004, the surface acoustic wave filter 1006, and the reception amplifier 1007.

The transmission amplifier 1002 is a balanced type high-power amplifier of amplifying a transmission signal to be used for transmission.

The reception amplifier 1007 is a balanced type low-noise amplifier of amplifying a reception signal to be used for reception.

The surface acoustic wave filter 1003 is a transmission filter which is similar in configuration to the surface acoustic wave filter of Embodiment 1. The surface acoustic wave filter 1003 has a balanced type terminal and an unbalanced type terminal of connecting the balanced type transmission amplifier 1002 and the unbalanced type switch 1004.

The surface acoustic-wave filter 1006 is a reception filter which is similar in configuration to the surface acoustic wave filter of Embodiment 1. The surface acoustic wave filter 1006 has a balanced type terminal and an unbalanced type terminal of connecting the balanced type reception amplifier 1007 and the unbalanced type switch 1004.

The following will discuss the operation of the communication apparatus of the present embodiment.

Since the same operation is performed for reception, the following will discuss a transmitting operation when transmission is performed.

The transmitting circuit 1001 outputs a transmission signal to be transmitted to the transmission amplifier 1002.

The transmission amplifier 1002 inputs and amplifies a transmission signal outputted from the transmitting circuit 1001, and outputs the amplified transmission signal to the surface acoustic wave filter 1003.

The surface acoustic wave filter 1003 is fed with the amplified transmission signal, which has been outputted from the transmission amplifier 1002, from the balanced type terminal and filters the signal, and the surface acoustic wave filter 1003 outputs the filtered transmission signal to the switch 1004 from the unbalanced type terminal.

The switch 1004 is fed with the transmission signal, which has been filtered and outputted by the surface acoustic wave filter 1003, and transmits the transmission signal by radio waves from the antenna 1005.

The surface acoustic wave filter 1003 is similar in configuration to the surface acoustic wave filter of Embodiment 1 and has a preferred balance characteristic, and the communication apparatus of the present embodiment thus achieves a high-performance transmitting operation.

Since the surface acoustic wave filter 1006 is similar in configuration to the surface acoustic wave filter of Embodiment 1, the communication apparatus of the present embodiment can achieve a high-performance receiving operation for the same reason.

The above description discussed the detail of Embodiments 1 to 9.

Although the number of the first IDT electrodes of the present invention are one or two in the above embodiments, the number is not limited to one or two. Thus, three or more IDT electrodes may be provided.

Further, although the number of the second IDT electrodes of the present invention was one or two in the above embodiments, the number is not limited to one or two. Thus, three or more IDT electrodes may be provided.

For example, when the number of the first IDT electrodes is two and the number of the second IDT electrodes is three (or the number of the first IDT electrodes is three and the number of the second IDT electrodes is two), a surface acoustic wave filter of longitudinally coupled mode type can be constituted by five electrodes.

Moreover, in the above embodiments, the first IDT electrode of the present invention has a plurality of electrode fingers which are composed of an aluminum alloy and are shaped like comb teeth. However, the configuration is not limited to the above. For example, the first IDT electrode of the present invention may have a plurality of electrode fingers which are shaped like comb teeth composed of alloys of, for example, Cu, Al, Au, Al—Cu.

Moreover, in the above embodiments, the second IDT electrode of the present invention has a plurality of electrode fingers which are composed of an aluminum alloy and are shaped like comb teeth. However, the configuration is not limited to the above. For example, the second IDT electrode of the present invention may have a plurality of electrode fingers which are composed of alloys of, for example, Cu, Al, Au, Al—Cu and are shaped like comb teeth.

The plurality of electrode fingers shaped like comb teeth may form single electrodes where the electrodes fingers are arranged alternately one by one, or the electrode fingers may form double electrodes where the electrode fingers are arranged alternately by two. Weighting such as so-called withdrawing and apodization may be used.

Further, in the above embodiments, the dielectric thin film of the present invention is configured using silicon nitride. However, the configuration is not limited to the above. For example, the dielectric thin film of the present invention may be configured using a material such as silicon oxide (SiO).

Moreover, in the above present embodiments, the covering dielectric thin film of the present invention is configured using silicon nitride. However, the configuration is not limited to the above. For example the covering dielectric thin film of the present invention may be configured using a material such as silicon oxide (SiO).

As a matter of course, the dielectric thin film and the covering dielectric thin film are configured using the same material in the above embodiments. The configuration is not limited to the above and the same material may not be used. For example, the dielectric thin film 205 (see FIG. 12(*b*)) may be configured using silicon nitride and the covering dielectric thin film 206 (see FIG. 12(*b*)) may be configured using silicon oxide.

Further, a thin film made of a material such as aluminium nitride (AlN) and zinc oxide (ZnO) having a piezoelectric property may be used to form a dielectric thin film which is smaller in effective relative dielectric constant than the piezoelectric substrate.

Moreover, in the above embodiments, the piezoelectric substrate of the present invention is configured using lithium tantalate. However, the configuration is not limited to the above. For example, the substrate of the present invention may be configured using a material such as lithium niobate ($LiNbO_3$) and potassium niobate ($KNbO_3$).

Additionally, in the above embodiments, the surface acoustic wave filter of the present invention is of longitudinally coupled mode type. The type of the surface acoustic wave filter is not limited thereto. For example, it is also possible to adopt (1) a ladder type of connecting a plurality of resonators (FIGS. 6(*a*) and 6(*b*)) like a ladder and (2) a lattice type of connecting the resonators like a lattice.

Further, in the above embodiments, the balanced type semiconductor of the present invention is a balanced type amplifier. The type of the semiconductor is not limited thereto. For example, a balanced type mixer is also applicable.

As is evident from the above description, the present invention is advantageous in that the surface acoustic wave filter can achieve a preferred balance characteristic.

The invention claimed is:

1. A surface acoustic wave filter, comprising:
   a piezoelectric substrate,
   a first IDT electrode which is formed on the piezoelectric substrate and is connected to a balanced type terminal,
   a second IDT electrode which is formed on the piezoelectric substrate and is connected to a balanced type terminal or an unbalanced type terminal,
   a connection electrode connecting the first IDT electrode and the second IDT electrode to the balanced type terminal or the unbalanced type terminal, respectively, and
   a dielectric thin film formed between the piezoelectric substrate and the connection electrode but not formed between the piezoelectric substrate, and the first IDT electrode and the second IDT electrode.

2. The surface acoustic wave filter according to claim 1, wherein the connection electrode comprises a first connection electrode connecting the first IDT electrode to the balanced type terminal and a second connection electrode connecting the second IDT electrode to the balanced type terminal or the unbalanced type terminal, and
   the dielectric thin film is formed so as to further reduce at least one of (a) a capacitance between the first IDT electrode and the second IDT electrode, (b) a capacitance between the first IDT electrode and the second connection electrode, (c) a capacitance between the first connection electrode and the second IDT electrode, and (d) a capacitance between the first connection electrode and the second connection electrode.

3. The surface acoustic wave filter according to claim 1, wherein the dielectric thin film is smaller in effective relative dielectric constant than the piezoelectric substrate.

4. The surface acoustic wave filter according to claim 3, wherein the dielectric thin film has a piezoelectric property.

5. The surface acoustic wave filter according to claim 3, wherein the piezoelectric substrate has an effective relative dielectric constant of about 40 or more.

6. The surface acoustic wave filter according to claim 1, comprising a covering dielectric thin film formed on at least one of the first IDT electrode, the second IDT electrode, and the connection electrode.

7. The surface acoustic wave filter according to claim 1, wherein the first IDT electrode and the second IDT electrode are arranged with a main propagating direction of a surface acoustic wave to be propagated on the piezoelectric substrate.

8. The surface acoustic wave filter according to claim 7, wherein the first IDT electrode is composed of two IDT electrodes arranged respectively on both sides of the second IDT electrode along the main propagating direction.

9. The surface acoustic wave filter according to claim 7, wherein the second IDT electrode is composed of two IDT electrodes arranged respectively on both sides of the first IDT electrode along the main propagating direction.

10. The surface acoustic wave filter according to claim 7, further comprising two reflector electrodes between which the first IDT electrode and the second IDT electrode are arranged.

11. The surface acoustic wave filter according to claim 1, wherein the second IDT electrode is connected to the unbalanced type terminal.

12. The surface acoustic wave filter according to claim 1, wherein the dielectric thin film comprises silicon nitride or silicon oxide.

13. The surface acoustic wave filter according to claim 1, wherein the piezoelectric substrate comprises lithium tantalate or lithium niobate.

14. A balanced type circuit, comprising:
a balanced type semiconductor, performing on a transmission signal for transmission and/or a reception signal for reception, and
a surface acoustic wave filter according to claim 1, being connected to the balanced type semiconductor and filtering on the transmission signal for transmission and/or the reception signal for reception.

15. A communication apparatus, comprising:
transmitting and receiving means of performing transmission and/or reception, and
a surface acoustic wave filter according to claim 1, performing filtering on a transmission signal for transmission and/or a reception signal for reception.

* * * * *